(12) United States Patent
Kato

(10) Patent No.: US 7,541,614 B2
(45) Date of Patent: Jun. 2, 2009

(54) INTEGRATED CIRCUIT, SEMICONDUCTOR DEVICE COMPRISING THE SAME, ELECTRONIC DEVICE HAVING THE SAME, AND DRIVING METHOD OF THE SAME

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/793,806

(22) Filed: Mar. 8, 2004

(65) Prior Publication Data
US 2004/0246765 A1    Dec. 9, 2004

(30) Foreign Application Priority Data
Mar. 11, 2003  (JP) .............................. 2003-065314
Mar. 11, 2003  (JP) .............................. 2003-065393

(51) Int. Cl.
*H01L 29/76* (2006.01)

(52) U.S. Cl. ..................... 257/66; 257/72; 257/366; 365/149

(58) Field of Classification Search ............ 365/149, 365/108, 109, 184, 189.01; 257/250, 296, 257/365, 366; 438/176, 157
See application file for complete search history.

(56) References Cited

U.S. PATENT DOCUMENTS

| | | | |
|---|---|---|---|
| 5,124,769 A | 6/1992 | Tanaka et al. | |
| 5,347,154 A * | 9/1994 | Takahashi et al. | 257/347 |
| 5,486,708 A * | 1/1996 | Takahashi et al. | 257/59 |
| 5,540,785 A * | 7/1996 | Dennard et al. | 148/33.2 |
| 5,572,045 A * | 11/1996 | Takahashi et al. | 257/59 |
| 5,644,147 A | 7/1997 | Yamazaki et al. | |
| 5,672,888 A * | 9/1997 | Nakamura | 257/72 |
| 5,728,591 A * | 3/1998 | Takahashi et al. | 438/30 |
| 5,818,070 A | 10/1998 | Yamazaki et al. | |
| 5,835,172 A * | 11/1998 | Yeo et al. | 349/46 |
| 6,323,108 B1 * | 11/2001 | Kub et al. | 438/458 |
| 6,326,642 B1 * | 12/2001 | Yamazaki et al. | 257/59 |
| 6,365,933 B1 | 4/2002 | Yamazaki et al. | |
| 6,372,608 B1 * | 4/2002 | Shimoda et al. | 438/455 |
| 6,509,217 B1 | 1/2003 | Reddy | |
| 6,548,848 B2 | 4/2003 | Horiguchi et al. | |
| 6,569,717 B1 * | 5/2003 | Murade | 438/149 |
| 6,580,214 B2 * | 6/2003 | Yoneda et al. | 313/506 |
| 6,590,230 B1 | 7/2003 | Yamazaki et al. | |
| 6,687,152 B2 | 2/2004 | Ohsawa | |
| 6,765,549 B1 * | 7/2004 | Yamazaki et al. | 345/80 |

(Continued)

FOREIGN PATENT DOCUMENTS

JP      10-135468      5/1998

(Continued)

*Primary Examiner*—Gene N. Auduong
(74) *Attorney, Agent, or Firm*—Fish & Richardson P.C.

(57) ABSTRACT

An integrated circuit mounting a DRAM which can realize high integration without complicated manufacturing steps. The integrated circuit according to the invention comprises a DRAM in which a plurality of memory cells each having a thin film transistor are disposed. The thin film transistor comprises an active layer including a channel forming region, and first and second electrodes overlapping with each other with the channel forming region interposed therebetween. By controlling a drain voltage of the thin film transistor according to data, it is determined whether to accumulate holes in the channel forming region or not, and data is read out by confirming whether or not holes are accumulated.

14 Claims, 14 Drawing Sheets

U.S. PATENT DOCUMENTS

| | | |
|---|---|---|
| 6,774,574 B1 | 8/2004 | Koyama |
| 6,778,424 B2 * | 8/2004 | Iwata et al. ................. 365/149 |
| 6,794,675 B1 * | 9/2004 | Suzuki et al. ................. 257/40 |
| 6,803,974 B2 * | 10/2004 | Kamoshida et al. ........... 349/42 |
| 6,956,324 B2 | 10/2005 | Yamazaki |
| 6,982,194 B2 | 1/2006 | Tsunoda et al. |
| 7,189,997 B2 | 3/2007 | Tsunoda et al. |
| 7,200,050 B2 * | 4/2007 | Kato .................... 365/189.09 |
| 2002/0030440 A1 | 3/2002 | Yamazaki |
| 2002/0179964 A1 | 12/2002 | Kato et al. |
| 2003/0164500 A1 | 9/2003 | Tsunoda et al. |
| 2004/0140547 A1 * | 7/2004 | Yamazaki et al. ........... 257/686 |
| 2005/0036382 A1 | 2/2005 | Kato |
| 2007/0147165 A1 * | 6/2007 | Kato .................... 365/230.06 |

FOREIGN PATENT DOCUMENTS

| | | |
|---|---|---|
| JP | 10-135469 | 5/1998 |
| JP | 2001-005426 | 1/2001 |
| JP | 2002-246571 | 8/2002 |
| JP | 2002-343886 | 11/2002 |
| JP | 2002-359376 | 12/2002 |

* cited by examiner

Program
$V_{ds} \geq V_{ip}$
$V_{gs} > V_{th}$

Hold
$V_{ds} \approx 0$
$V_{gs} \leq V_{th}$

Read
$0 < V_{ds} < V_{ip}$
$V_{gs} > V_{th}$

Purge
$0 < V_{ds} < V_{ip}$
$V_{gs} > V_{th}$

FIG.3A

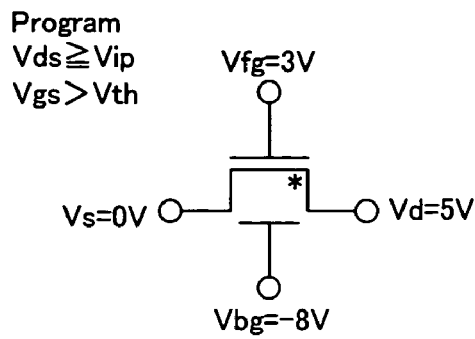

Program
$V_{ds} \geq V_{ip}$
$V_{gs} > V_{th}$
$V_{fg}=3V$
$V_s=0V$
$V_d=5V$
$V_{bg}=-8V$

FIG.3B

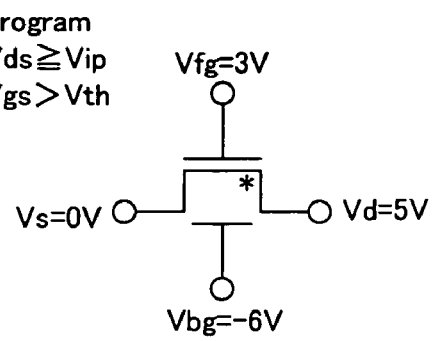

Program
$V_{ds} \geq V_{ip}$
$V_{gs} > V_{th}$
$V_{fg}=3V$
$V_s=0V$
$V_d=5V$
$V_{bg}=-6V$

FIG.3C

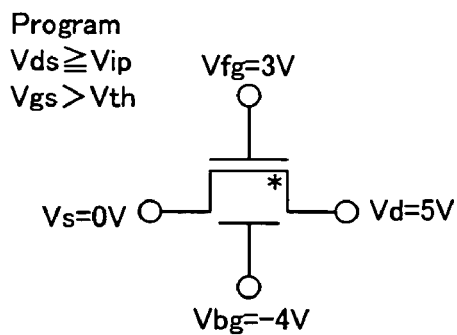

Program
$V_{ds} \geq V_{ip}$
$V_{gs} > V_{th}$
$V_{fg}=3V$
$V_s=0V$
$V_d=5V$
$V_{bg}=-4V$

FIG.3D

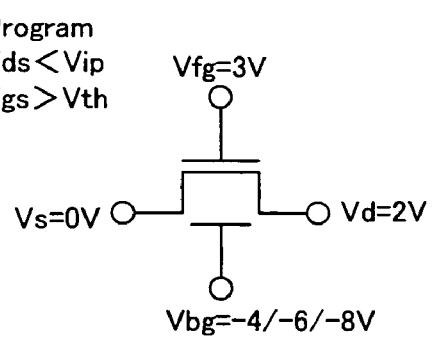

Program
$V_{ds} < V_{ip}$
$V_{gs} > V_{th}$
$V_{fg}=3V$
$V_s=0V$
$V_d=2V$
$V_{bg}=-4/-6/-8V$

FIG.3E

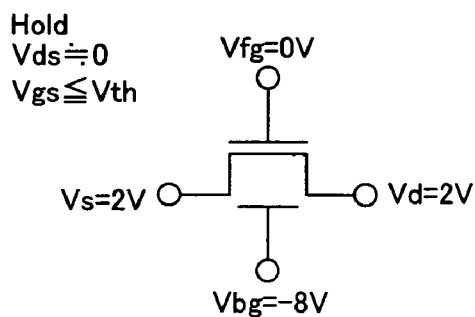

Hold
$V_{ds} \doteq 0$
$V_{gs} \leq V_{th}$
$V_{fg}=0V$
$V_s=2V$
$V_d=2V$
$V_{bg}=-8V$

FIG.3F

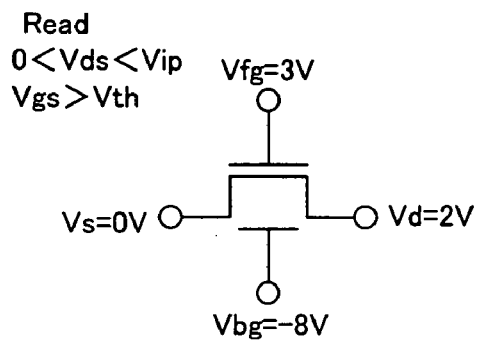

Read
$0 < V_{ds} < V_{ip}$
$V_{gs} > V_{th}$
$V_{fg}=3V$
$V_s=0V$
$V_d=2V$
$V_{bg}=-8V$

FIG.3G

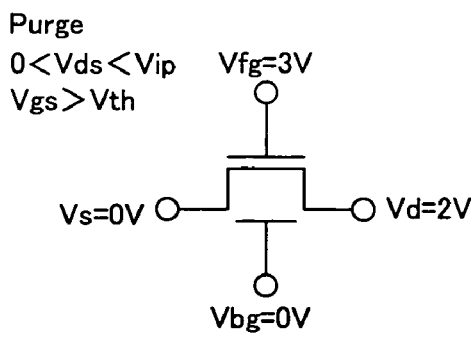

Purge
$0 < V_{ds} < V_{ip}$
$V_{gs} > V_{th}$
$V_{fg}=3V$
$V_s=0V$
$V_d=2V$
$V_{bg}=0V$

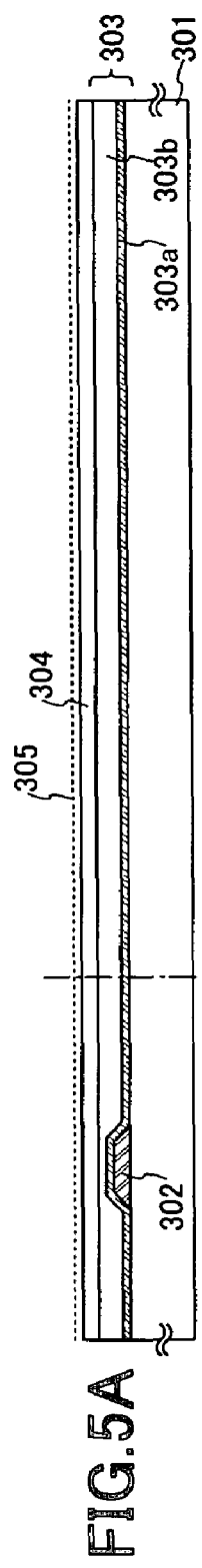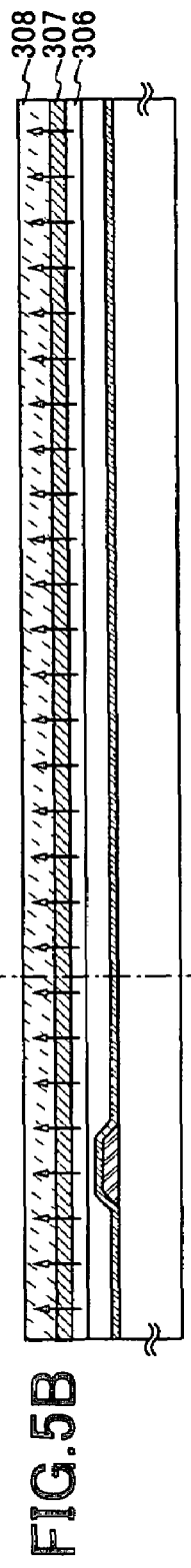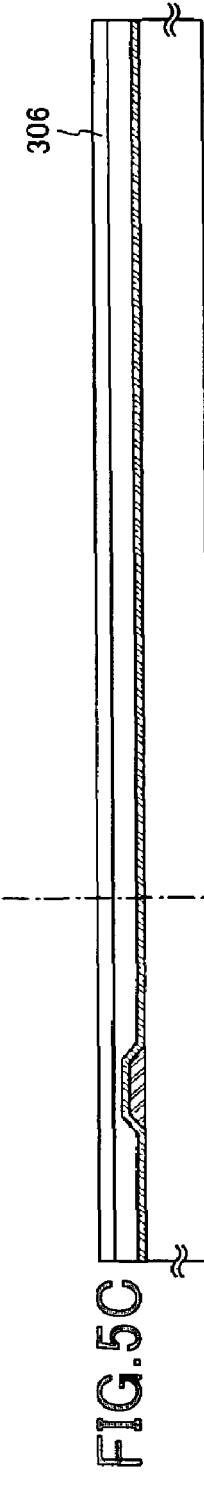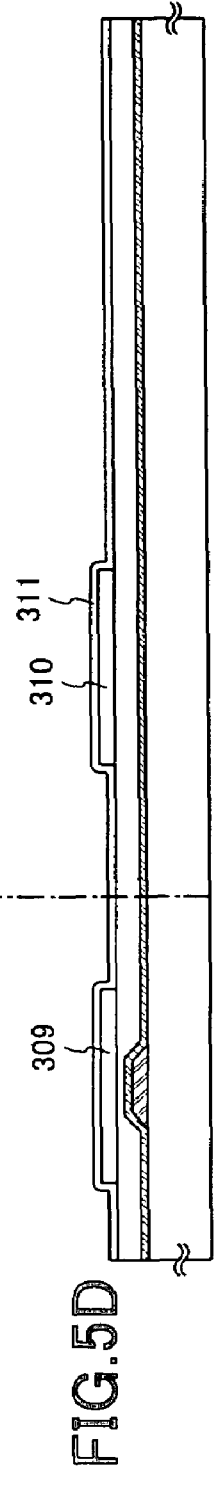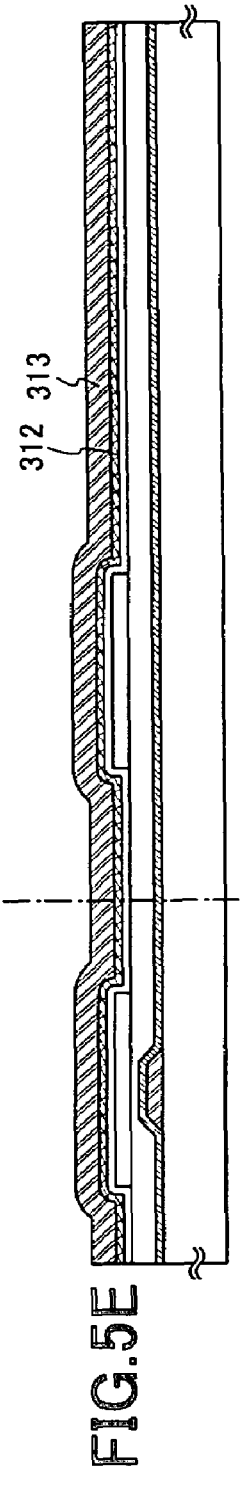

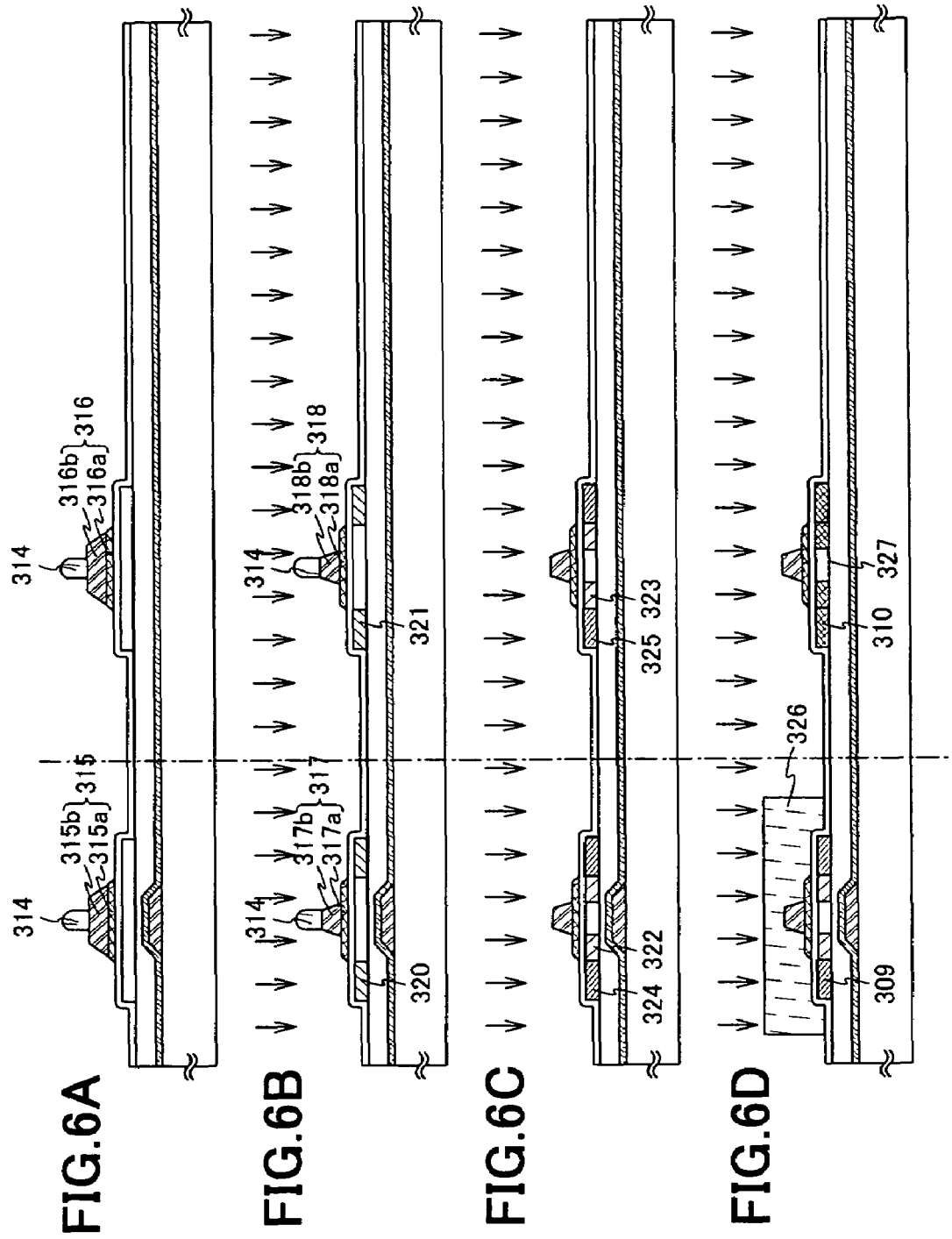

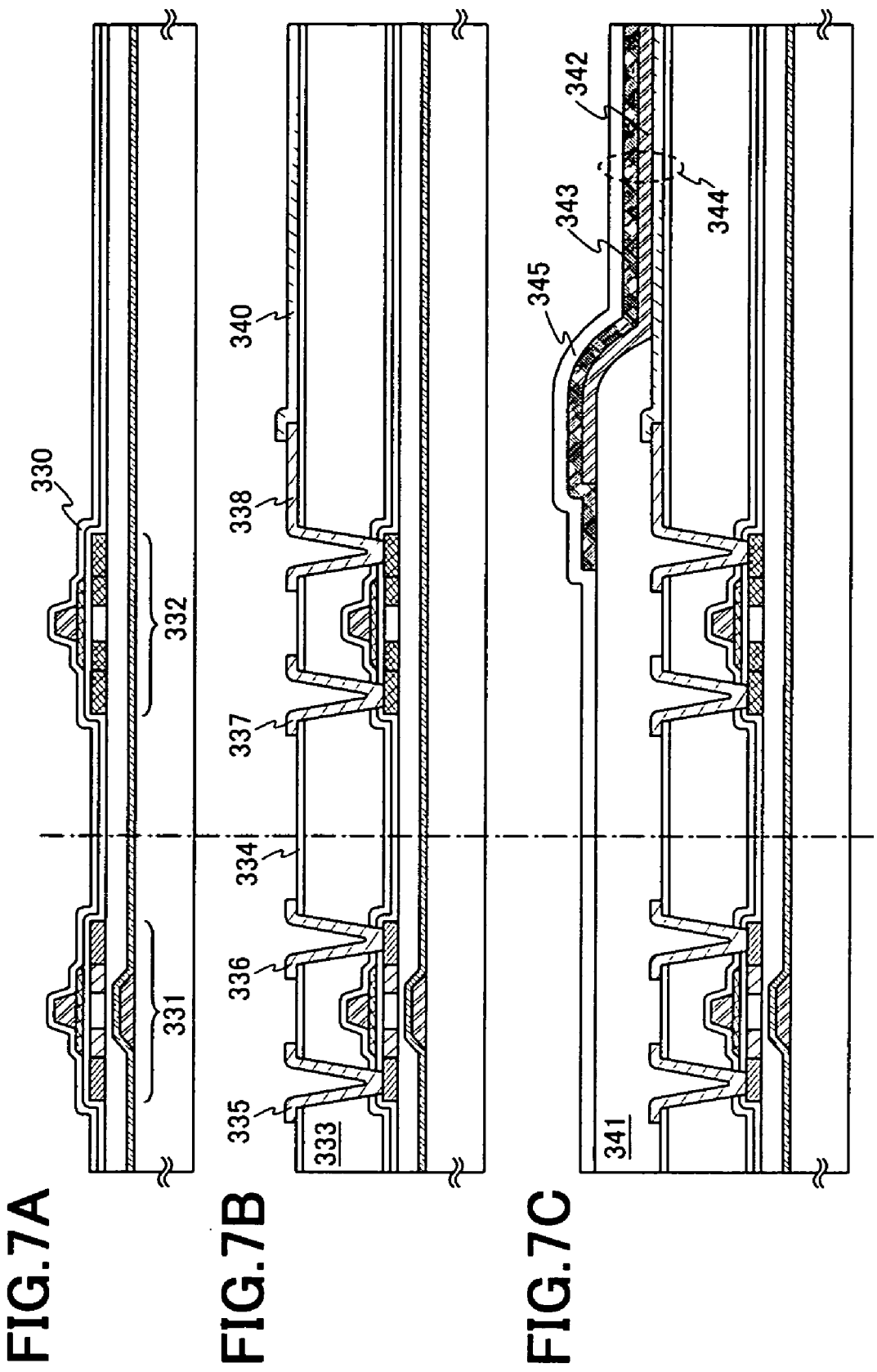

INTEGRATED CIRCUIT, SEMICONDUCTOR DEVICE COMPRISING THE SAME, ELECTRONIC DEVICE HAVING THE SAME, AND DRIVING METHOD OF THE SAME

BACKGROUND OF THE INVENTION

1. Field of the Invention

The present invention relates to an integrated circuit mounting DRAM formed by using a thin film semiconductor film, and more particularly to a semiconductor display device (semiconductor device) comprising the integrated circuit and a driving method of the integrated circuit.

2. Description of the Related Art

Generally, a flat panel display formed by using an inexpensive glass substrate has a problem in that, the periphery of a pixel portion (frame area) which is used for mounting occupies larger area of the substrate as resolution becomes high, and this makes it difficult to produce a compact flat panel display. Therefore, it is considered that there is a limitation with regard to a method for mounting an IC which is formed by using a single crystal silicon wafer on a substrate, and thus technology for monolithically forming an integrated circuit and a pixel portion onto a glass substrate, namely development of a system-on-panel is expected to be advanced.

A configuration of a dual-gate thin film transistor which is one of the semiconductor elements formed on a glass substrate is disclosed in the following Patent Document 1.

[Patent Document 1]

Japanese Patent Laid-Open No. 2002-359376

Since an integrated circuit formed on a glass substrate has a lower degree of integration than that formed on a single crystal silicon wafer, the realization of high integration is an important subject in view of its practical use. In particular, enlargement of capacitance of a semiconductor memory is indispensable to achieve a high-performance integrated circuit as well as the high integration. Among semiconductor memories, DRAM (Dynamic Random Access Memory) is superior to other semiconductor memories in its large capacity and low cost. DRAM generally comprises a simple memory cell in which one transistor and one capacitor are arranged, and the smaller number of semiconductor elements are used to configure the DRAM memory cell as compared to other semiconductor memories such as SRAM. Therefore, the large number of memory cells can be embedded into one tip, thus makes it easier to produce an LSI having large memory capacity, leading to low cost per bit as compared to other semiconductor memories.

Thus, DRAM can be thought as one of the essential semiconductor memories in promoting high integration of an integrated circuit which is formed on a glass substrate.

SUMMARY OF THE INVENTION

As described above, DRAM plays an important role for achieving large memory capacity, however, when the degree of integration of an LSI is further to be increased while reducing the chip size, an area occupied by the memory needs to be reduced as well as other semiconductor memories. This requires an area of each memory cell to be even smaller. In the case of downsizing a memory cell in a DRAM, storage capacitance has to be maintained at more than the certain value so as to reduce the frequency of refresh operations, to secure an enough time for a sense operation, and to reduce soft errors due to an a ray. Thus far, various attempts have been made to secure storage capacitance while reducing an area occupied by a memory cell, such as optimization of a material used for a dielectric film and three-dimensionalization of a capacitor.

However, there is a limitation for the optimization of a material of a dielectric film, and it is thus difficult to obtain a material having a drastically low dielectric constant. In addition, a DRAM formed with a three-dimensionalized capacitor, such as a stack memory cell and a trench memory cell, is effective for reduction in tip size, however, it is disadvantageous in that cost per bit becomes high as its manufacturing steps are complicated as compared to those of DRAM using a planar memory cell. Therefore, it is difficult to achieve high integration of DRAM by utilizing its advantages of large memory capacity and low cost.

In view of the foregoing, the invention provides an integrated circuit mounting DRAM which can realize high integration without complicated manufacturing steps. In addition, the invention relates to a driving method of the integrated circuit and a semiconductor display device using the integrated circuit.

To solve the above-mentioned problems, a DRAM which is mounted on an integrated circuit of the invention comprises a plurality of memory cells, each of which is disposed with a dual-gate thin film transistor having a first gate electrode, a second gate electrode, an active layer including a channel forming region, a first insulating layer and a second insulating layer. The active layer is interposed between the first gate electrode and the second gate electrode, the first insulating layer is interposed between the active layer and the first gate electrode, and the second insulating layer is interposed between the active layer and the second gate electrode. According to the thin film transistor having the above structure of the invention, data is written or read by means of a charge that is accumulated in a channel forming region by impact ionization.

Impact ionization can be controlled by a drain voltage. When a drain voltage is raised to form a high electric field of about 100 kV/cm or more, carriers that have reached threshold energy of ionization cause impact ionization, thereby generating electron-hole pairs. The generated electrons flow into a drain region and the holes flow into a source region. By controlling a potential of the first gate electrode, the generated holes can be accumulated in the channel forming region. Specifically, the holes flow into the source region when a potential of the first gate electrode is equal to or higher than that of the source region, and the holes are accumulated in the channel forming region when a potential of the first gate electrode is lower than that of the source region. As the accumulation of the holes is kept on until the potential at the first gate electrode side of the channel forming region becomes equal to that of the source region, the cumulative amount of holes can be controlled by a potential of the first gate electrode.

When holes are accumulated in the channel forming region, a threshold voltage shifts as the potential at the first gate electrode side in the channel forming region increases, thus increases a drain current. Therefore, an accumulation state of the holes (charges) can be confirmed according to the magnitude of the obtained drain current. Therefore, data is written by the accumulated charges in the channel forming region, and it is read by the drain current or the threshold voltage.

Since holes are accumulated until a potential at the first gate electrode side of the channel forming region becomes equal to a potential of the source region, the cumulative amount of holes can be controlled by a potential of the first gate electrode. According to the invention, data having three states or more may be written by selecting a plurality of different potentials to be supplied to the first gate electrode in writing data, and making difference in the cumulative amount of holes after writing. Then, by utilizing a characteristic such that a threshold voltage or a drain current is increased in accordance with the increase in the cumulative amount of holes, data having three states or more is read out. According to the above configuration, memory capacity of a DRAM can be increased while reducing an occupying area.

In addition, since accumulated charges can be kept for a certain period of time according to the invention, unlike general DRAMs using capacitors, it is possible to read out data without rewriting the data even after reading out the data by a drain current. Therefore, power saving of DRAMs can be achieved by reducing the number of rewritings when the same data is needed. However, when overwriting new data onto previous data, it is required before writing the new data that the previous data is completely deleted by raising a potential of the first gate electrode to discharge (purge) the accumulated charges.

It is to be noted that, refresh operation is required in the DRAM of the invention as well as general DRAMs. This is because the difference of the amount of charges between when they are accumulated in the channel forming region and when they are not are gradually decreased according mainly to thermal generation of electron-hole pairs. In the refresh operation, data is rewritten after purging the accumulated charges by raising a potential of the first gate electrode in the similar manner to the overwriting of new data.

Also, when a thin film transistor is compared to a transistor formed by using a single crystal semiconductor film, it is generally thought that charges are easily leaked out due to a grain boundary in an active layer, leading to a short holding time of charges. In particular, in the case of multi-state data having three states or more, the difference of the charge amount between each state tends to become smaller as the number of states increases as four, five, and more, thus it is difficult to keep accuracy of data. However, as for a transistor formed by using a single crystal semiconductor film, the conventional process has to be made a drastic change in forming two gate electrodes interposing an active layer, thereby leading to more complicated steps and further to a high cost. In view of these problems, the invention uses a semiconductor film, which is crystallized by means of a metal catalyst, as an active layer of a thin film transistor. It has been verified that in a semiconductor film crystallized by means of metal catalyst, two different crystal grains are joined with very good matching at the grain boundary as disclosed in Japanese Patent Laid-Open No. 2001-5426. In other words, the film has a structure in which crystal lattices are continuously joined at the crystal grain boundary, and which is very hard to create trap levels ascribable to crystal defects and the like. Therefore, there are small regions to become a generative nucleus of an electron-hole pair, and thus a thin film transistor having high charge retention characteristics can be realized even in processing data having multiple states. Also, a step for manufacturing the second gate electrode can be additionally provided with ease without making the overall steps complicated as compared to the case of a single crystal transistor. Therefore, cost rise with the complicated steps can be suppressed unlike the case of forming a single crystal transistor.

It is to be noted that, a thin film transistor of the invention is an SOI (silicon on insulator) of a complete depletion type. A complete depletion SOI transistor can be realized when a film thickness of an active layer is thin, and the depletion layer spreads widely in the active layer. A single crystal SOI substrate has a problem in that it cannot easily provide a very thin single crystal silicon film, whereas a thin film transistor can provide a very thin active layer by depositing a semiconductor layer.

In addition to the method of using a metal catalyst, other methods such as thermal crystallization using an electrically heated oven, laser crystallization using a laser beam, lamp anneal crystallization using infrared light can be used to crystallize a thin semiconductor layer. However, a semiconductor film crystallized by these methods is inferior in matching of the two different crystal grains at a crystal grain boundary as compared to the case of using a metal catalyst, thus it tends to create a number of trap levels ascribable to crystal defects and the like. When there are a number of such trap levels, electron hole pairs are generated due to the level that serves as a nucleus, therefore, charge retention characteristics are deteriorated. When the charge retention characteristics are low, frequency of refresh operations has to be increased and data writing or reading needs to be performed without overlapping with each other, thus operating rate is lowered.

In addition, in the semiconductor film which is crystallized by means of a metal catalyst, characteristic variations of a thin film transistor for holding charges can be decreased since the size and crystal orientation of crystal grains are relatively uniform as compared to those formed by other crystallization. As an operating condition of a memory is determined based on the distribution (variations) in characteristics of a number of memory cells, it is advantageous to obtain a thin film transistor with small characteristic variations in view of various operating conditions such as a frequency of refresh operations, a potential supplied to a bit line and a word line, thus power consumption and operating rate can be improved.

As described above, according to the invention, data can be stored by using one thin film transistor, thus no additional capacitors are required and a memory cell area can be reduced. Therefore, high integration and large memory capacity of an integrated circuit mounting a DRAM can be realized while cutting costs. Further, according to the high integration and large memory capacity of an integrated circuit, the integrated circuit occupies a smaller area of a substrate on which a pixel portion of a flat panel is formed together, thus high-performance system-on-panel can be implemented.

It is to be noted that, according to the invention, a DRAM can be operated by providing at least one thin film transistor for each memory cell, however, the number of thin film transistors is not limited to this, and a plurality of transistors may also be employed for each memory cell. For example, not only a thin film transistor for storing data, but also a thin film transistor used for switching may be employed so that the former thin film transistor may hold the stored data with accuracy. However, the thin film transistor used for switching may not necessarily be of a dual gate type, and a single gate thin film transistor that is present only in either side of an active layer may also be employed.

It is to be noted that, the integrated circuit of the invention includes all integrated circuits using DRAM such as a microprocessor and an image processing circuit. A semiconductor display device of the invention includes a liquid crystal display device, a light emitting device comprising a light emitting element represented by an organic light emitting diode (OLED) for each pixel, a DMD (Digital Micromirror Device), a PDP (Plasma Display Panel), an FED (Field Emission Display), and other display devices in which circuit elements using semiconductor films are employed in their driver circuits and the like.

Further, according to the invention, a plurality of different potentials to be supplied to a first gate electrode can be selected in writing, and by writing data having three states or more, memory capacity of a DRAM can be increased while reducing its occupying area.

BRIEF DESCRIPTION OF THE DRAWINGS

FIGS. 3A to 3G are circuit diagrams to explain the operation of a TFT which is used as a memory element.

FIGS. 5A to 5E are views showing a method for manufacturing a semiconductor display device of the invention.

FIGS. 6A to 6D are views showing a method for manufacturing a semiconductor display device of the invention.

FIGS. 7A to 7C are views showing a method for manufacturing a semiconductor display device of the invention.

DETAILED DESCRIPTION OF THE INVENTION

Embodiment Mode

Figure 1A:
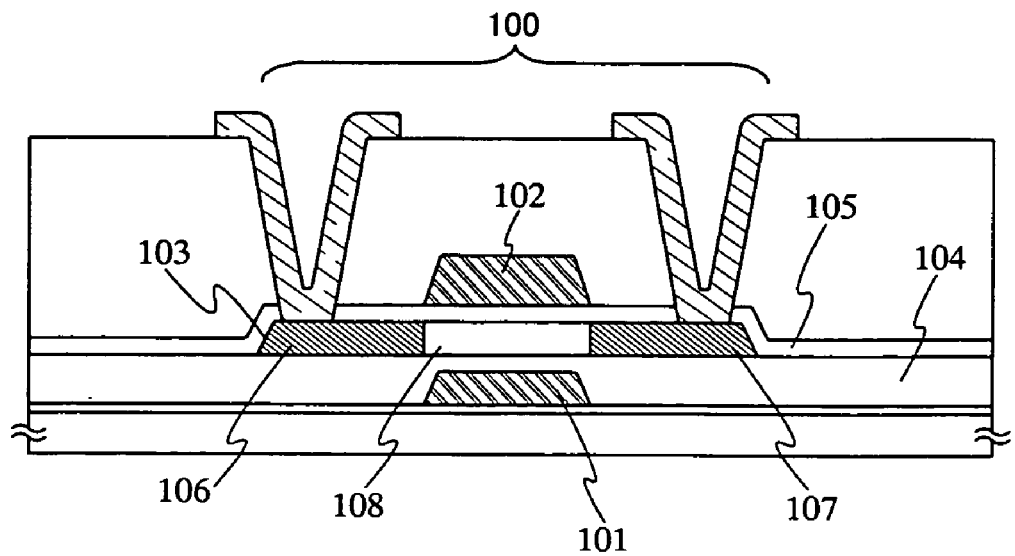
FIGS. 1A and 1B are cross-sectional views of a TFT which is used as a memory element in the present invention.
Figure 1B:
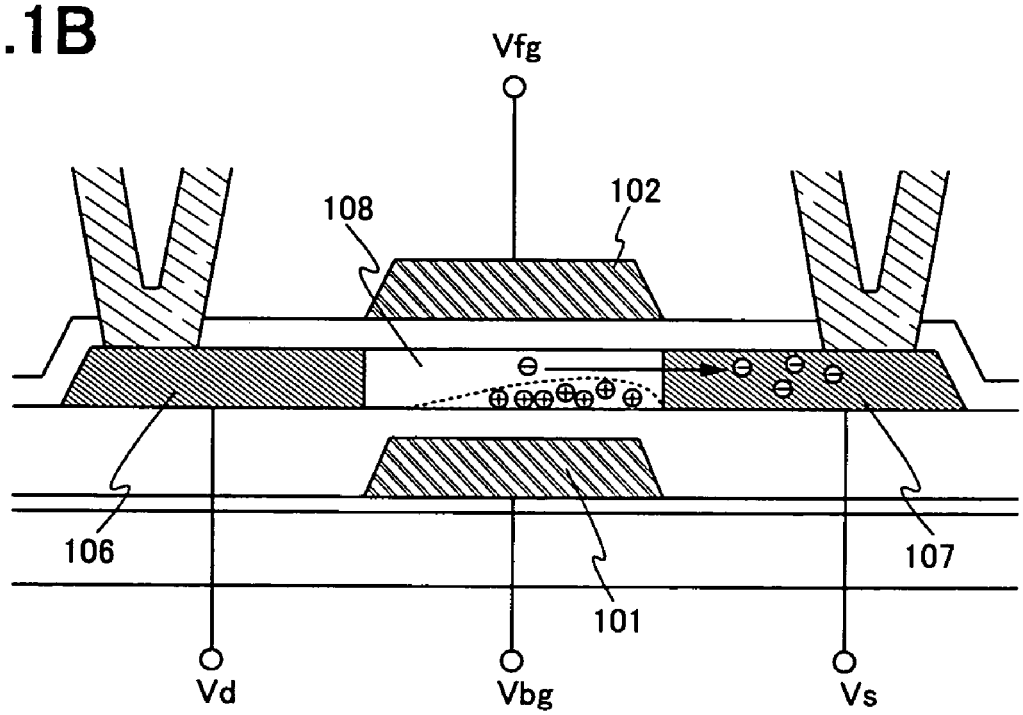

With reference to FIGS. 1A and 1B, a structure of a DRAM which is used in an integrated circuit of the present invention is described. FIG. 1A shows a cross-sectional view of a dual gate thin film transistor (TFT) 100 which is disposed in each memory cell.

The TFT 100, which is used as a memory element in the invention, comprises two electrodes (hereinafter referred to as a first gate electrode 101 and a second gate electrode 102), an active layer 103, a first insulating layer 104, and a second insulating layer 105. The active layer 103 comprises a source region 106, a drain region 107, and a channel forming region sandwiched between the source region 106 and the drain region 107.

As shown in FIG. 1A, the active layer 103 is sandwiched between the first gate electrode 101 and the second gate electrode 102, and the first insulating layer 104 is sandwiched between the first gate electrode 101 and the active layer 103, and further the second insulating layer is sandwiched between the second gate electrode 102 and the active layer 103.

It is to be noted that, the structure of the active layer 103 is not limited to the one shown in FIG. 1A, and it may have an LDD (Light Doped Drain) region, and one or a plurality of impurity regions which overlap with the first gate electrode 101 or the second gate electrode 102 for example. Also, a part of the channel forming region 108 may not necessarily overlap with the first gate electrode 101 or the second gate electrode 102.

According to a potential to be supplied to the first gate electrode 101, the second gate electrode 102, the source region 106, and the drain region 107, various operations of the DRAM can be controlled. Specifically, impact ionization in data writing (Program) can be controlled according to a potential supplied to the source region 106 and the drain region 107.

FIG. 1B shows a pattern diagram showing a state where holes are accumulated during impact ionization. FIG. 1B is an enlarged view of the TFT shown in FIG. 1 A, in which a potential of the first gate electrode 101 is referred to as Vbg, a potential of the second gate electrode 102 as Vfg, a potential of the source region 106 as Vs, and a potential of the drain region 107 as Vd.

Impact ionization can be caused by raising a drain voltage (referred to as Vds) which is obtained by subtracting the potential Vs of the source region 106 from the potential Vd of the drain region 107. The drain voltage Vds is adjusted so as to form an electric field that is high enough to reach threshold energy of impact ionization. The value of the drain voltage Vds that causes impact ionization differs depending on the structure or characteristics of a TFT, specifically such as crystallinity of an active layer and an impurity concentration. According to the invention, the value of the drain voltage Vds may be set in such a manner that data can be written or read out based on the variations in threshold voltage or drain current derived from impact ionization.

When impact ionization occurs, electron-hole pairs are generated, and the generated electrons flow into the drain region, and the holes flow into the source region. Some of the holes are accumulated in the channel forming region 108 as indicated by '+' in FIG. 1B. By making a potential of the first gate electrode 101 lower than the potential Vs of the source region, the amount of holes to be accumulated can be controlled and further can be held.

Further, according to the invention, the cumulative amount of holes may be controlled by selecting a plurality of different potentials, which are lower than the potential Vs, to supply to the first gate.

When holes are accumulated, a potential at the first gate electrode side of the channel forming region is raised corresponding to the cumulative amount of holes, whereby a threshold voltage and a drain current of the TFT are changed as well. Specifically, the larger the cumulative amount of holes are, the higher the threshold voltage is and the larger the drain current is. Data can be read out by utilizing the threshold voltage or the drain current which is changed according to the impact ionization. Each bit of data may have two states, or three or more states.

Next, a method for controlling a potential of a TFT for storing data at each operation is described with reference to FIGS. 2A to 2D.

Figure 2A:
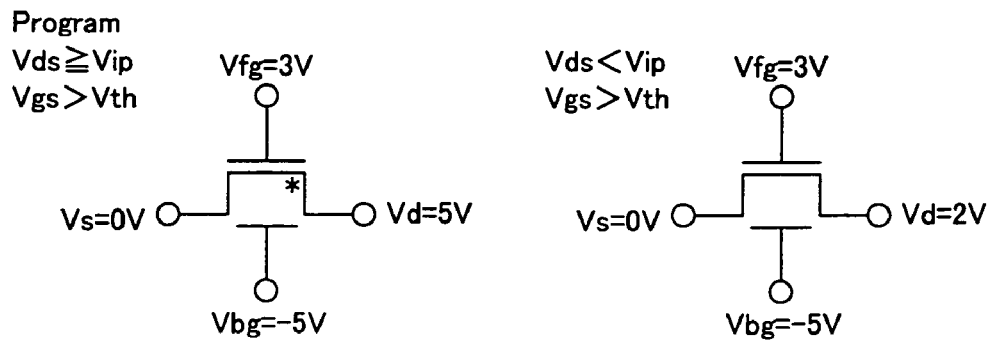
FIGS. 2A to 2D are circuit diagrams to explain the operation of a TFT which is used as a memory element.

First, an operation in data writing (Program) is explained. FIG. 2A shows an example of a circuit diagram of a TFT and potentials which are supplied to each part in data writing. Note that, shown in FIGS. 2A to 2D are examples in the case of storing data having two states to a DRAM.

In writing data, a gate voltage (referred to as Vgs) which is obtained by subtracting a potential Vs of a source region from a potential Vfg of a second gate electrode is set higher than a threshold voltage Vth of the TFT so as to turn ON the TFT. A drain voltage Vds is changed depending on whether holes are accumulated by impact ionization or not. In the case of accumulating holes by impact ionization, the drain voltage Vds is set equal to or higher than a voltage that causes impact ionization (referred to as Vip here) as shown in a left diagram of FIG. 2A. On the other hand, in the case of accumulating no holes intentionally, the drain voltage Vds is set lower than the voltage Vip as shown in a right diagram of FIG. 2A. Then, in either case, a potential Vbg of the first gate electrode is kept lower than a potential Vs of the source region so as to hold the state of charges in the channel forming region.

In FIG. 2A, it is assumed in the left diagram that Vs=0 V, Vd=5 V, Vbg=−5 V, and Vfg=3 V and in the right diagram that Vs=0 V, Vd=2 V, Vbg=−5 V, and Vfg=3 V.

Figure 2B:
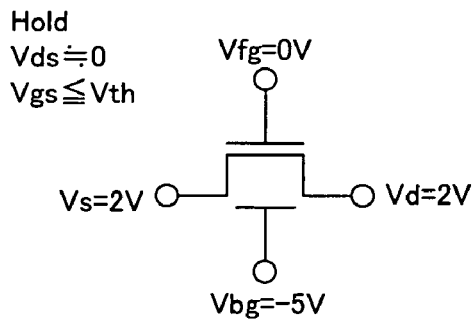

Next, FIG. 2B shows an example of a circuit diagram of a TFT and potentials which are supplied to each part in holding data (Hold) which has been written. In holding data, the gate voltage Vgs is set equal to or smaller than the threshold voltage Vth (Vgs≦Vth) so as to hold the written data, thereby turning OFF the TFT. In order to keep the state of charge without causing impact ionization, Vds is set approximately equal to 0, and the potential Vbg of the first gate electrode is kept lower than the potential Vs of the source region.

In FIG. 2B, it is assumed that Vs=2 V, Vd=2 V, Vbg=−5 V, and Vfg=0 V.

Figure 2C:
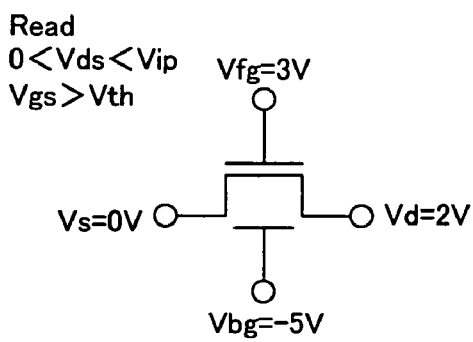

Next, FIG. 2C shows an example of a circuit diagram of a TFT and potentials which are supplied to each part in reading data (Read) which has been held in FIG. 2B. In reading data, the gate voltage Vgs is set higher than the threshold voltage Vth (Vgs>Vth) so as to read out the held data, thereby turning ON the TFT. In order to read out the data without causing impact ionization while keeping the state of charge, 0<Vds<Vip is satisfied and the potential Vbg of the first gate electrode is kept lower than the potential Vs of the source region.

In FIG. 2C, it is assumed that Vs=0 V, Vd=2 V, Vbg=−5 V, and Vfg=3 V.

Figure 2D:
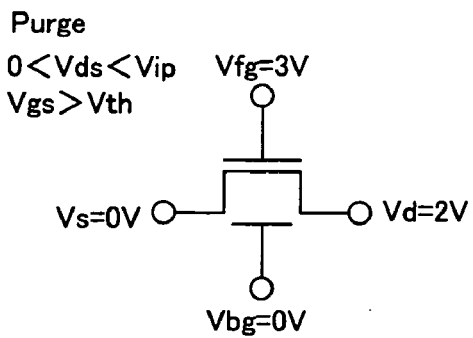

Next, a purge operation (Purge) which is performed in rewriting or refreshing (Refresh) data is described. An example of a circuit diagram of a TFT and potentials which are supplied to each part in purge operation is shown in FIG. 2D. In purging, the gate voltage Vgs is set higher than the threshold voltage Vth (Vgs>Vth) to release the held charge, thereby turning ON the TFT. In order to release charges without causing impact ionization, 0<Vds<Vip is satisfied. It is to be noted that, the potential Vbg of the first gate electrode is desirably set higher than the potentials in writing, holding, and reading out data. More desirably, the potential Vbg of the first gate electrode is set equal to or higher than the potential Vs of the source region (Vbg≧Vs) though it is not essential since charges can be released when a high potential is supplied to the potential Vfg even in the case where the potential Vbg of the first gate electrode is kept lower than the potential Vs of the source region. However, the above setting contributes to the timesaving of the purge operation.

In FIG. 2D, it is assumed that Vs=0 V, Vd=2 V, Vbg=0 V, and Vfg=3 V.

As described above, a series of operations including writing, reading, holding, and purging can be performed by using a TFT. It is to be noted that, the specific values of Vs, Vd, Vbg, and Vfg shown in FIGS. 2A to 2D are only examples, and the invention is not limited to these.

Next, a method for controlling a potential of a TFT which stores data having four states is described with reference to FIGS. 3A to 3G.

First, an operation in data writing (Program) is explained. FIGS. 3A to 3D are examples each showing a circuit diagram of a TFT and potentials which are supplied to each part in writing data having four states. It is to be noted that, shown in FIGS. 3A to 3D are examples where data having fours states are stored, however, the state of data is not exclusively limited to four, and data may have various states such as three, five, or more.

In writing data, a gate voltage (referred to as Vgs) which is obtained by subtracting a potential Vs of a source region from a potential Vfg of a second gate electrode is set higher than a threshold voltage Vth of the TFT so as to turn ON the TFT in all the circuits shown in FIGS. 3A to 3D regardless of a content of data.

A drain voltage Vds is changed depending on whether holes are accumulated by impact ionization or not. In the case of accumulating holes by impact ionization, the drain voltage Vds is set equal to or higher than a voltage that causes impact ionization (referred to as Vip here) as shown in FIGS. 3A to 3C. On the other hand, in the case of accumulating no holes intentionally, the drain voltage Vds is set lower than the voltage Vip as shown in FIG. 3D.

Then, in all the circuits shown in FIGS. 3A to 3D, a potential Vbg of the first gate electrode is kept lower than a potential Vs of the source region so as to hold the state of charge in the channel forming region. Further, according to the invention, each potential Vbg of the first gate electrode is changed in FIGS. 3A to 3C so that the cumulative amount of holes in each figure may be different from each other. Specifically, it is set in the following manner: the potential Vbg of the first gate electrode in FIG. 3A is set to be the lowest, FIG. 3B to be the second lowest, and FIG. 3C to be the highest of the three figures. Therefore, the cumulative amount of charges are larger in the order of FIG. 3C, FIG. 3B, and FIG. 3A.

In FIG. 3A, it is assumed that Vs=0 V, Vd=5 V, Vbg=−8 V, and Vfg=3 V. In FIG. 3B, it is assumed that Vs=0 V, Vd=5 V, Vbg=−6 V, and Vfg=3 V. In FIG. 3C, it is assumed that Vs=0 V, Vd=5 V, Vbg=−4 V, and Vfg=3 V. In FIG. 3D, it is assumed that Vs=0 V, Vd=5 V, Vbg=−4 V, and Vfg=3 V.

It is to be noted that, in the normal memory cell array, in which memory cells in the same row are connected to a common word line, data writing is performed over a plurality of times for every different data. That is, when the states of FIGS. 3A, 3B, 3C, and 3D are referred to as "3", "2", "1", and "0" in this order for example, a potential of a memory cell to which "1" is written is set at the state of FIG. 3C, and other cells are kept at the state of FIG. 3D (Vbg=−4 V). Similarly, a potential of a memory cell to which "2" is written is set at the state of FIG. 3B, and other memory cells are kept at the state of FIG. 3D (Vbg=−6 V). Further, a potential of a memory cell to which "3" is written is set at the state of FIG. 3A, and other memory cells are kept at the state of FIG. 3D (Vbg=−8 V). In this manner, all the memory cells can be written with the predetermined states. It is to be noted that, the writing order is not exclusively limited to the order of "1" to "3".

FIG. 3E shows an example of a circuit diagram of a TFT and potentials which are supplied to each part in holding data (Hold), which has been written in FIGS. 3A to 3D. In holding data, the gate voltage Vgs is set equal to or lower than the threshold voltage Vth (Vgs≦Vth) so as to hold the written data, thereby turning OFF the TFT. In order to hold the state of charge without causing impact ionization, Vds is set approximate equal to 0, and the potential Vbg of the first gate electrode is kept equal to or lower than the potential in data writing.

In FIG. 3E, it is assumed that Vs=2 V, Vd=2 V, Vbg=−8 V, and Vfg=0 V to enable data holding regardless of the cumulative amount of holes after writing.

FIG. 3F shows an example of a circuit diagram of a TFT and potentials which are supplied to each part in reading data (Read), which has been held in FIG. 3E. In reading data, the gate voltage Vgs is set higher than the threshold voltage Vth (Vgs>Vth) so as to read the data which has been held, thereby turning ON the TFT. In order to hold the state of charge without causing impact ionization, 0<Vds<Vip is satisfied and the potential Vbg of the first gate electrode is kept equal to or lower than the potential in data writing.

By applying such voltages in the above manner, the held data can be read out according to the a threshold voltage of a TFT, which is determined by the cumulative amount of holes, and further to the difference between drain currents or on-resistance. Note that, it is also possible to perform reading of multi-state data through a plurality of times.

In FIG. 3F, it is assumed that Vs=0 V, Vd=2 V, Vbg=−8 V, and Vfg=3 V.

Next, purge operation (Purge) which is performed in rewriting or refreshing (Refresh) data is described. An example of a circuit diagram of a TFT and potentials which are supplied to each part in purge operation is shown in FIG. 3G. In purging, the gate voltage Vgs is set higher than the threshold voltage Vth (Vgs>Vth) to release the held charges, thereby turning ON the TFT. In order to release charges without causing impact ionization, 0<Vds<Vip is satisfied. It is to be noted that, the potential Vbg of the first gate electrode is desirably set higher than the potentials in writing, holding, and reading out data. More desirably, the potential Vbg of the first gate electrode is set equal to or higher than the potential Vs of the source region (Vbg≧Vs) though it is not essential since charges can be released when a high potential is supplied to the potential Vfg even in the case where the potential Vbg of the first gate electrode is kept lower than the potential Vs of the source region. However, the above setting contributes to the timesaving of purge operation.

In FIG. 3G, it is assumed that Vs=0 V, Vd=2 V, Vbg=0 V, and Vfg=3 V.

As described above, a series of operations including writing, reading, holding, and purging can be performed by using a TFT. Also, data having multiple states can be stored by selecting a plurality of values for the potential Vbg of the first gate electrode, therefore, 2-bit data such as '11', '10', '01', and '00', for example, can be stored in one memory cell. It is to be noted that, the specific values of Vs, Vd, Vbg, and Vfg shown in FIGS. 3A to 3G are only examples, and therefore the invention is not limited to these.

Figure 4A:
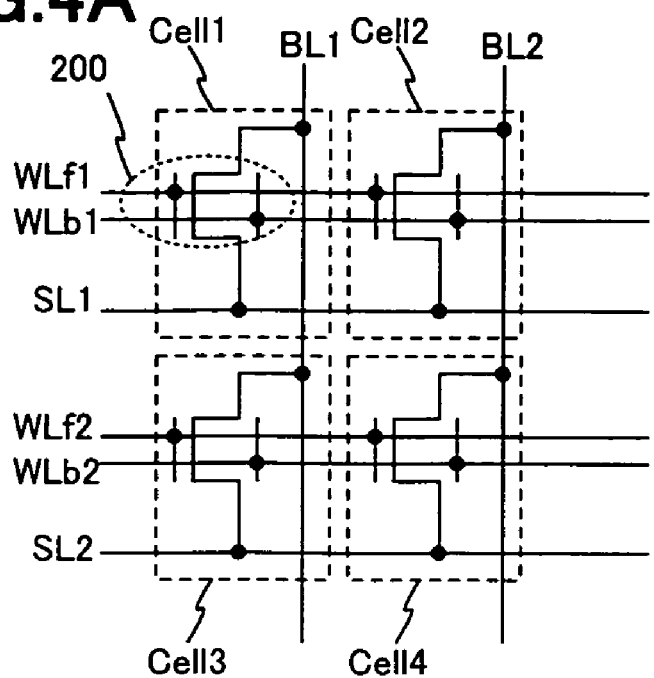
FIGS. 4A and 4B are a circuit diagram of a cell array of a DRAM and a timing chart respectively.
Figure 4B:
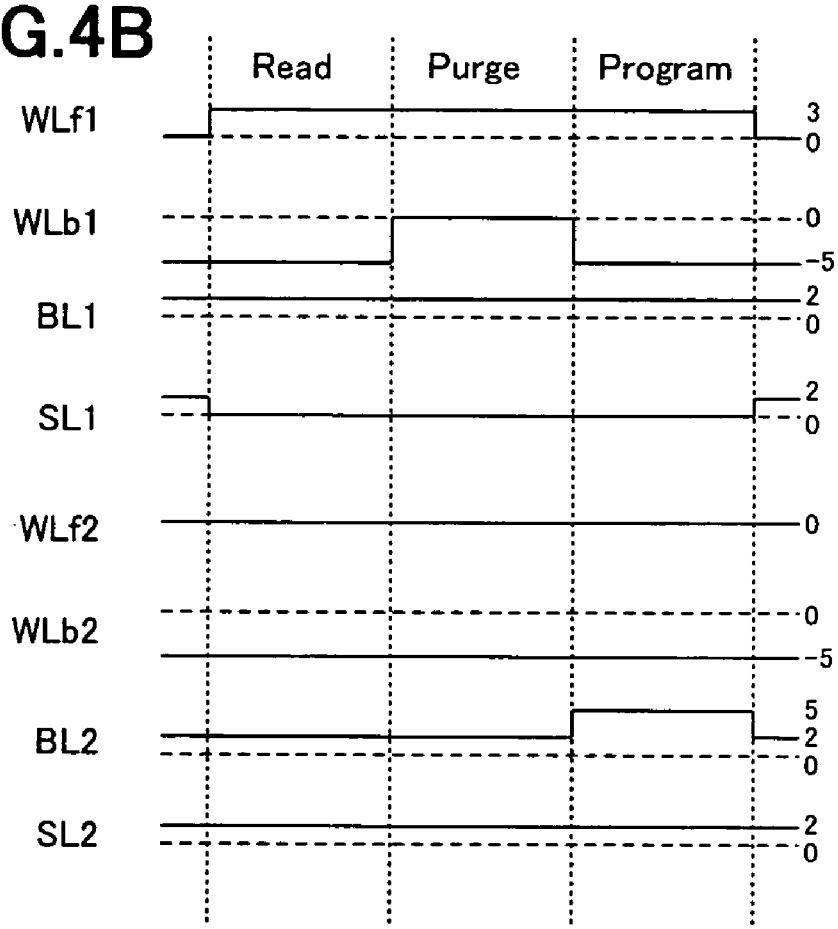

In DRAM, a plurality of memory cells each having the above-described TFT are disposed in a memory cell array in practice. Referring now to FIGS. 4A and 4B, each of the above-described operations in a memory cell array comprising a plurality of memory cells is described.

First, an example of wiring connections between each memory cell is shown in FIG. 4A. FIG. 4A shows a circuit diagram of a cell array having four memory cells (Cell1, Cell2, Cell3, and Cell4), each of which comprises a TFT 200 for storing data. Although four memory cells are disposed in a memory cell array in FIG. 4A, the number of memory cells is, needless to mention, not limited to this.

The TFT 200 in each memory cell receives potentials Vbg and Vfg from two word lines WLb and WLf respectively, a potential Vd from a bit line BL, and a potential Vs from a source line SL. Note that, the layout of each wiring is not limited to the configuration shown in FIG. 4A.

Specifically, In FIG. 4A, the memory cell (Cell1) corresponds to word lines WLb1 and WLf1, a bit line BL1, and a source line SL 1, and the memory cell (Cell2) corresponds to the word lines WLb1 and WLf1, a bit line BL2, and the source line SL1. Further, the memory cell (Cell3) corresponds to word lines WLb2 and WLf2, the bit line BL1, and a source line SL2, and the memory cell (Cell4) corresponds to the word lines WLb2 and WLf2, the bit line BL2, and the source line SL 2.

FIG. 4B shows an example of a timing chart in which the memory cells (Cell1) and (Cell2) in the first row are refreshed. Although the relationship between the potentials Vs, Vd, Vbg, and Vfg which are supplied to each memory cell during each period is shown with reference to FIGS. 2A to 2D here, FIGS. 3A to 3G may be referred as well.

Refresh operation is carried out in order to prevent data, which is stored in a memory cell, from being lost as the time passes. Specifically, during refresh operation, data which is stored in the memory cell is, after being read out once, rewritten into the same memory cell. Refresh operation needs to be carried out periodically. According to the invention, the period is determined based on the cumulative amount of holes which are held in a channel forming region of a transistor. Refresh operation according to the invention is performed through a series of operations such as reading, purging, and writing. Purge operation is an operation in which holes accumulated in a channel forming region of a transistor are all released, thereby resetting the state of a memory cell.

Purge operation (refresh operation including purge operation) according to the invention is performed at the same time in the memory cells which use the word line WLb in common, namely in one row of memory cells. On the other hand, writing and reading can be individually performed in each memory, or in one row of memory cells at the same time in the same manner as the purge operation. Therefore, according to the invention, reading and writing are performed per bit in accordance with a bus width, or per row of memory cells and the like, while refresh operation is performed per row of memory cells. In addition, as the storage of data having multiple states is sensitive to stress, it is preferable that writing and reading are performed per row of memory cells as well.

Data, which is firstly read out, is once stored in a latch circuit (not shown), and then rewritten into a memory cell after purging. In this embodiment mode, data is written so that the memory cell (Cell1) will have a state in which no holes are accumulated (the "0" state), and the memory cell (Cell2) will have a state in which holes are accumulated (the "1" state). It is to be noted that, in writing, a potential supplied to the memory cell (Cell4) is also changed by the BL2 (stress in writing), and what is important here is that a potential is set so that the holes accumulated in the memory cell (Cell4) are not influenced due to the potential change.

It is also to be noted that, when writing data immediately after turning ON the switch, there may be cases where charges are already accumulated due to heat, static electricity, or the like, therefore, data is desirably written after purging.

Next, a method for fabricating a light emitting device in which an integrated circuit mounting a DRAM and a pixel portion are formed on the same substrate is described. Here, an example of a TFT for controlling a current supply to an OLED is described in addition to a DRAM mounted on an integrated circuit.

First, as shown in FIG. 5A, a first electrode 302 of a DRAM of the invention is formed on an insulating surface of a substrate 301. The first electrode 302 can be formed by using one or a plurality of types of conductive materials selected from a group consisting of aluminum (Al), tungsten (W), molybdenum (Mo), titanium (Ti) and tantalum (Ta). Although W is employed in this embodiment mode, W stacked on TaN may be used as well to form the first electrode 302. Further, not only a single layer structure, but also a multi-layer structure can be employed.

A glass substrate such as barium borosilicate glass and alumino borosilicate glass, a quartz substrate, a ceramic substrate, and the like may be used as the substrate 301. Also, a metal substrate including stainless (SUS) substrate or a silicon substrate formed with an insulating film on its surface may be used as the substrate 301. Further, although a substrate formed from a synthetic resin having flexibility, such as a plastic substrate, generally has a lower heat resistance temperature as compared to the substrates described above, it is possible to use the synthetic resin substrate as long as it can withstand the processing temperatures in the manufacturing steps.

Next, a first insulating layer 303 is formed so as to cover the first electrode 302. In this embodiment mode, the first insulating layer 303 has a laminated structure of a first insulating layer A 303a and a first insulating layer B 303b. The first insulating layer A 303a is formed of a silicon oxynitride film with a thickness of 10 to 50 nm. The first insulating layer B 303b is formed of a silicon oxide film or a silicon oxynitride film with a thickness of 0.5 to 1 μm. It is to be noted that, the structure of the first insulating layer 303 is not exclusively limited to this, and it may be formed of a single layer film, or a multi-layer film having three layers or more. In addition, materials are not limited to the above.

The surface of the first insulating layer 303 (surface of the first insulating layer B 303b here) may have irregularities due to the previously formed first electrode 302. In this case, it is desirable to provide a step for flattening the substrate. In this embodiment mode, flattening is carried out by means of CMP (Chemical Mechanical Polishing). For a polishing agent (slurry) of CMP with respect to the first insulating layer 303, for example, a slurry in which fumed silica particles obtained by thermally decomposing silicon chloride gas are dispersed in a KOH-added aqueous solution may be used. By CMP, the first insulating layer is removed by about 0.1 to 0.5 ì m so as to make the surface flat.

Next, an amorphous semiconductor layer 304 having a film thickness of 50 nm is formed on the first insulating layer 303 by plasma CVD (Chemical Vapor Deposition). It is desirable that, although depending upon its hydrogen content, the amorphous semiconductor layer 304 is heated at 400 to 550° C. for several hours to be dehydrogenated, and crystallized with the hydrogen content of 5 atom % or less. Moreover, the amorphous semiconductor layer may be formed by other methods such as sputtering and vapor deposition, however, it is desirable that impurity elements such as oxygen and nitrogen contained in the film have been previously and sufficiently reduced.

It is to be noted that, not only silicon but also silicon germanium, for example, can be used for the semiconductor layer. When silicon germanium is used, it is desirable that the density of germanium is on the order of 0.01 to 4.5 atom %.

It is also to be noted that, when forming both of the first insulating layer 303 and the amorphous semiconductor layer 304 by plasma CVD, these films may be formed in succession without being exposed to the atmosphere. By forming the films in succession, contamination to the surfaces of the films by atmosphere can be prevented to the utmost, thereby reducing the variations in characteristics of a TFT to be formed.

Subsequently, a catalytic is doped to the amorphous semiconductor layer 304. In this embodiment mode, a nickel acetate solution containing 1 to 100 ppm of nickel by weight is applied by a spinner. In order to improve hydrophilic to the nickel acetate solution, it may be carried out that the surface of the amorphous semiconductor layer 304 is processed with ozone containing aqueous solution to form a quite thin oxide film, then the oxide film is etched with mixed solution of sulfuric acid and aqueous hydrogen peroxide to clean off the surface, and ozone containing aqueous solution is again used to form another quite thin oxide film. Since a surface of a semiconductor layer is originally hydrophobic, the formation of the oxide film in the above manner makes it possible to apply nickel acetate solution uniformly (FIG. 5A).

It is needless to mention that, doping of a catalyst to the amorphous semiconductor layer is not limited to the above method, and sputtering, vapor deposition, plasma processing and the like may also be employed.

Next, heat treatment is applied at 500 to 650° C. for 4 to 24 hours, for example, at 570° C. for 14 hours. By performing heat treatment, crystallization is promoted by a nickel-containing layer 305, thus a semiconductor layer with enhanced crystallinity is formed.

As means of the heat treatment, furnace annealing with an electric furnace or RTA (Rapid Thermal Annealing) may be employed. Although a halogen lamp, a metal halide lamp, a xenon arc lamp, a carbon arc lamp, a high-pressure sodium lamp, a high-pressure mercury lamp, or the like is generally used in RTA, gas-heating type RTA, which uses heated inert gas, may also be employed.

In the case of using RTA, a light source of a lamp for heating is turned ON for 1 to 60 seconds, preferably for 30 to 60 seconds, and this operation is repeated once to 10 times, preferably, 2 to 6 times. Although light intensity of the light source of the lamp is optional, it is necessary that the amorphous semiconductor layer 304 be heated instantaneously at a temperature of 600 to 1000° C., preferably, 650 to 750° C. Even if the temperature is quite high as above, only the semiconductor layer is instantaneously heated, and the substrate 301 is not deformed.

In the case of using furnace annealing, heat treatment is performed at 500° C. for 1 hour to discharge hydrogen contained in the amorphous semiconductor layer 304 before the heat treatment for crystallization. Then, heat treatment is performed by using an electric furnace in a nitrogen atmosphere at 550 to 600° C., preferably at 580° C., for 4 hours to crystallize the amorphous semiconductor layer 304.

Although nickel (Ni) is used as the catalytic element in this embodiment mode, an element such as germanium (Ge), iron (Fe), palladium (Pa), tin (Sn), lead (Pb), cobalt (Co), platinum (Pt), copper (Cu), and gold (Au) may be adopted.

Described next is gettering of the catalytic element existing within a crystalline semiconductor layer 306. It is considered that the catalytic element (nickel here) remains with a concentration over $1 \times 10^{19}$ atoms/cm$^3$ on average in the crystalline semiconductor layer 306 after the crystallization with the catalytic element. Since there is a possibility of a bad influence brought on TFT characteristics if the catalytic element remains, it is necessary to provide a process for reducing the concentration of the catalytic element.

Various types of gettering can be employed, and, described in this embodiment mode is an example of gettering which is performed before patterning the crystalline semiconductor layer 306. First, a barrier layer 307 is formed on the surface of the crystalline semiconductor layer 306 as shown in FIG. 5B. The barrier layer 307 is provided in order to prevent the crystalline semiconductor layer 306 from being etched in later removing a gettering site.

A thickness of the barrier layer 307 is set on the order of 1 to 10 nm, and chemical oxide which is formed by processing with ozone water may be used as the barrier layer as well. Further, chemical oxide can also be formed by processing with an aqueous solution in which an acid such as sulfuric acid, hydrochloric acid, or nitric acid is mixed with aqueous hydrogen peroxide. As another method, plasma treatment may be performed in an oxidizing atmosphere, or oxidation treatment may be performed, in which ozone is generated by irradiating ultraviolet light in an oxygen-containing atmosphere. In addition, a clean oven may also be used for heating the film at a temperature on the order of 200 to 350° C. to form a thin oxide film as a barrier layer. Furthermore, an oxide film with a thickness on the order of 1 to 5 nm may also be deposited as a barrier layer by plasma CVD, sputtering, vapor deposition, and the like. In either case, a film, through which the catalytic element is capable of moving to the gettering site in the step of gettering and no etchant soaks in the step of removing the gettering site (a film which protects the crystalline semiconductor layer 306 from the etchant), for example, such as a chemical oxide film formed by processing with ozone water, a silicon oxide film (SiOx), and a porous film may be used.

Next, as a gettering site 308, a semiconductor layer for gettering (typically, an amorphous silicon film) containing an inert gas element at a concentration of $1 \times 10^{20}$ atoms/cm$^3$ or more is formed on the barrier layer 307 by sputtering to have a film thickness of 25 to 250 nm. It is desirable that the gettering site 308 which is to be later removed is formed to have a low density in order to obtain a large etching selectivity ratio to the crystalline semiconductor layer 306.

It is to be noted that an inert gas element which itself is inert in a semiconductor film has no bad influence on the crystalline semiconductor layer 306. As an inert gas element, one or a plurality of elements selected from the group consisting of helium (He), neon (Ne), argon (Ar), krypton (Kr), and xenon (Xe) are used.

Next, heat treatment with furnace annealing or RTA is performed to achieve gettering (FIG. 5B). In the case of using furnace annealing, heat treatment is performed in a nitrogen atmosphere at 450 to 600° C. for 0.5 to 12 hours. In the case of using RTA, a light source of a lamp for heating is turned on for 1 to 60 seconds, preferably for 30 to 60 seconds, and this operation is repeated 1 to 10 times, preferably, 2 to 6 times. Although light intensity of the light source of the lamp is optional, it is necessary that the semiconductor layer be heated instantaneously at a temperature of 600 to 1000° C., preferably, 700 to 750° C.

According to the above heat treatment, the catalytic element in the crystalline semiconductor layer 306 is released by thermal energy and moved to the gettering site 308 by diffusion as shown by arrows. Thus, gettering depends upon the processing temperature and the higher the temperature is, the faster gettering proceeds.

After the completion of the gettering step, the gettering site 308 is selectively etched to be removed. As a means of etching, there is given dry etching which does not utilize ClF$_3$ plasma, or wet etching with an alkaline solution such as hydrazine or an aqueous solution containing tetraethyl-ammonium-hydroxide (chemical formula: $(CH_3)_4NOH$)). At this time, the barrier layer 307 functions as an etching stopper. After that, the barrier layer 307 is removed with hydrofluoric acid (FIG. 5C).

After removing the barrier layer 307, the crystalline semiconductor layer 306 is patterned to form island-shaped semiconductor films 309 and 310 (FIG. 5D). The semiconductor layers 309 and 310 are formed to have a thickness on the order of 25 to 100 nm (preferably from 30 to 60 nm). Subsequently, a second insulating layer 311 is formed so as to cover the semiconductor layers 309 and 310. The film thickness of the second insulating layer 311 is reduced by on the order of 10 to 20 nm during later dry etching for forming a second gate electrode, therefore it is desirable that the film thickness of the second insulating layer 311 be set by taking the reduction into account. Specifically, the second insulating layer 311 is formed to have a thickness on the order of 40 to 150 nm (preferably from 60 to 120 nm).

Silicon oxide, silicon nitride, silicon nitride oxide, and the like can be used for the second insulating layer 311, for example. Although the second insulating layer 311 has a single layer structure in this embodiment mode, it may have a laminated structure of two or more insulating layers. Further, plasma CVD, sputtering, and the like can be used as the deposition method. For example, silicon oxide is deposited by plasma CVD to form the second insulating layer 311, the deposition may be performed by using a mixed gas of tetraethyl orthosilicate (TEOS) and O$_2$, at a reaction pressure of 40 Pa, a substrate temperature of 300 to 400° C., and an RF power density (13.56 MHz) of 0.5 to 0.8 W/cm$^2$.

Further, aluminum nitride can also be used as the second insulating layer 311. The thermal conductivity coefficient of aluminum nitride is relatively high, and heat generated in the TFT can be dissipated efficiently. Further, an insulating layer on which aluminum nitride is laminated after forming silicon oxide, silicon oxynitride, or the like, which contain no aluminum, may also be used as the second insulating layer 311.

Next, a conductive layer is formed over the second insulating layer 311 (FIG. 5E). In this embodiment mode, a first conductive layer 312a comprising TaN is formed with a thickness of 20 to 100 nm, and a second conductive layer 312b comprising W is formed with a thickness of 100 to 400 nm. Specifically, the first conductive layer 312a of TaN is formed at a deposition speed of about 40 nm/min. This is achieved by using a Ta target having a purity of 99.99%, with an internal chamber temperature set at a room temperature, a gas flow rate for Ar set at 50 ml/min, a gas flow rate for N$_2$ set at 10 ml/min, an internal chamber pressure set at 0.6 Pa, and a deposition power set at 1 kW. Further, the second conductive layer 312b of W is formed at a deposition speed of approximately 390 nm/min. This is achieved by using a W target having a purity of 99.99%, with an internal chamber temperature set at 230° C., a gas flow rate for Ar set at 100 ml/min, an internal chamber pressure set at 1.5 Pa, and a deposition power set at 6 kW.

Described in this embodiment mode is an example in which the second electrode is formed by using a bilayer conductive film, however, a single layer structure or a multilayer structure having three or more layers may also be adopted. In addition, a material for each layer is not exclusively limited to the one shown in this embodiment mode.

Specifically, for each conductive layer, an element selected from the group consisting of Ta, W, Ti, Mo, Al, and Cu, or alloys or chemical compounds having one of these elements as its main component may be used. For example, a gate electrode in which Ta is used in the first layer and W in the second layer, a gate electrode in which TaN is used in the first layer and Al in the second layer, and a gate electrode in which TaN is used in the first layer and Cu in the second layer can all be considered. Also, a gate electrode in which an Ag—Pd—Cu alloy is used in either the first layer or the second layer may be used. A three-layer structure in which W, an alloy of Al and Si (Al—Si), and TiN are laminated in sequence may also be employed. Further, tungsten nitride may be used as a substitute for W, an alloy of Al and Ti (Al—Ti) may be used as a substitute for the alloy of Al and Si (Al—Si), and Ti may be used as a substitute for TiN as well. However, when forming a plurality of conductive layers, materials that have mutual etching selectivity ratio to each other are used in order to make differences in the width of the gate electrode in the channel length direction between each of the conductive layers.

Note that, it is very important to select optimal gas according to the materials used for conductive layers.

As shown in FIG. 6A, a mask 314 is formed next and etching is performed on the first conductive layer 312a and the second conductive layer 312b (first etching process). Etching is performed by using inductively coupled plasma (ICP) etching in this embodiment mode. A mixed gas of $Cl_2$, $CF_4$, and $O_2$ is used as an etching gas, and pressure of the etching gas within the chamber is set at 1.0 Pa. An RF power (13.56 MHz) of 500 W is applied to a coil shape electrode, thereby generating plasma. Further, an RF power (13.56 MHz) of 150 W is applied to a stage (lower electrode) on which the substrate is placed, thus applying a self-bias voltage to the substrate. The etching gas is then changed to a mixture of $Cl_2$ and $CF_4$, and the total pressure is set at 1.0 Pa. Further, an RF power (13.56 MHz) of 500 W is applied to the coil shape electrode, and an RF power (13.56 MHz) of 20 W is applied to the substrate side (test piece stage).

The etching rate of TaN, of which the first conductive layer 312a is formed, and the etching rate of W, of which the second conductive layer 312b is formed, become nearly equal to each other when $CF_4$ and $Cl_2$ are used as the etching gas, and both can undergo etching to the same level.

According to the first etching process, a first shape conductive layer 315 which is structured by a lower layer 315a and an upper layer 315b, and a first shape conductive layer 316 which is structured by a lower layer 316a and an upper layer 316b are formed. Note that, each sidewall of the lower layers 315a and 316b and of the upper layers 315b and 316b take on a slightly tapered shape in the first etching process. Further, when etching is performed so that no conductive film residue remains, a surface of the gate insulating layer 311 that is not covered with the first shape conductive layers 315 and 316 may undergo etching on the order of 5 to 10 nm or more.

Then, as shown in FIG. 6B, etching is performed on the first shape conductive layers 315 and 316 by using the mask 314 which has already been etched its surface and thus has become smaller in width by the first etching process (second etching process). The second etching process also employs ICP etching as the first etching process. A mixed gas of $SF_6$, $Cl_2$, and $O_2$ is used as an etching gas, and pressure of the etching gas within the chamber is set at 1.3 Pa. An RF power (13.56 MHz) of 700 W is applied to a coil shape electrode, generating plasma. Further, an RF power (13.56 MHz) of 10 W is applied to a stage (lower electrode) on which the substrate is placed, thereby applying a self-bias voltage to the substrate.

An etching rate of W is increased and an etching rate of TaN, which forms the lower layers 315b and 316b of the first shape conductive layers 315 and 316 respectively, is extremely reduced when $O_2$ is added to the mixed gas of $SF_6$ and $Cl_2$. Higher selectivity ratio (ratio of an etching rate of W to an etching rate of TaN) can therefore be achieved.

According to the second etching process, a second shape conductive layer 317 (structured by a lower layer 317a and an upper layer 317b), and a second shape conductive layer 318 (structured by a lower layer 318a and an upper layer 318b) are formed. The width of the upper layers 317b and 318b in the channel length direction is shorter than the width of the lower layers 317a and 317b. The second shape conductive layer 317 functions as a second gate electrode of a DRAM, and the second shape conductive layer 318 functions as a gate electrode of a TFT for controlling current supply to an OLED. Further, a surface of the second insulating layer 311 that is not covered with the second shape conductive films 317 and 318 undergoes etching on the order of 5 to 10 nm or more by the second etching process.

Next, as shown in FIG. 6B, impurities that impart n-type conductivity are added to the semiconductor layers 309 and 310 using the second shape conductive layers 317 and 318 as masks (first doping process). Doping is performed by ion implantation with a dose amount of $1 \times 10^{13}$ to $5 \times 10^{14}$ atoms/$cm^2$, and an acceleration voltage of 40 to 80 kV. Group 5 elements such as P, As, and Sb, and group 6 elements such as S, Te, and Se, which all function as donors, may be used as the impurity elements that impart n-type conductivity. In this embodiment mode, P is employed. By the first doping process, first impurity regions 320 and 321 are formed in a self-aligning manner. Impurity elements that impart n-type conductivity are doped into the first impurity regions 320 and 321 at a concentration range of $1 \times 10^{18}$ to $1 \times 10^{20}$ atoms/$cm^3$.

A second doping process is performed next as shown in FIG. 6C, using the upper layers 317b and 318b of the second shape conductive layers 317 and 318 as masks. The acceleration voltage used in the second doping process is set higher than that used in the first doping process to make the impurities pass through the lower layers 317a and 318a of the second shape conductive layers 317 and 318. The second doping process forms an LDD region, and therefore the dose amount of the n-type impurities are set lower than that used in the first doping process. Specifically, the acceleration voltage is set from 60 to 120 kV, and the dose amount is set from $1 \times 10^{13}$ to $1 \times 10^{15}$ atoms/$cm^2$.

A third doping process is performed next at an acceleration voltage set lower than that used in the second doping process in order to obtain the state shown in FIG. 6C. The acceleration voltage is set from 50 to 100 kV, and the dose amount is set from $1 \times 10^{15}$ to $1 \times 10^{17}$ atoms/$cm^2$ in the third doping process. Through the second and third doping processes, second impurity regions 322 and 323 which overlap with the lower layers 317a and 318a of the second shape conductive layers 317 and 318 respectively are formed, and further third impurity regions 324 and 325 are formed by doping more impurities into the first impurity regions 320 and 321. The n-type impurities are doped into the second impurity regions 322 and 323 at a concentration range of $1 \times 10^{18}$ to $5 \times 10^{19}$ atoms/$cm^3$, and the n-type impurities are doped into the third impurity regions 324 and 325 at a concentration range of $1 \times 10^{19}$ to $5 \times 10^{21}$ atoms/$cm^3$.

The second impurity regions 322 and 323 are formed inside the third impurity regions 324 and 325. The second impurity regions 322 and 323 function as LDD regions, and the third impurity regions 324 and 325 function as a source or a drain region.

Needless to say, it is also possible to form a low concentration impurity region and a high concentration impurity region by integrating the second doping process and the third doping process into one which is performed at a suitable acceleration voltage.

It is to be noted that, as the island-shaped semiconductor layer 310 on which a p-channel TFT is formed does not need to be doped with n-type impurities through the second and third doping processes shown in FIGS. 6B and 6C, it may be covered with a mask during the doping processes of n-type impurities. In addition, it is also possible not to provide masks for the purpose of reducing the number of masks, and increase the concentration of the p-type impurities, thereby inverting the polarity of the island-shaped semiconductor layer into p type. Described in this embodiment mode is an example in which a polarity of the island-shaped semiconductor layer is inverted into p-type.

As shown in FIG. 6D, by covering the n-channel island-shaped semiconductor layer 309 with a mask 326 including resist, p-type impurities are doped into the island-shaped semiconductor layer 310 (fourth doping process). In the fourth doping process, the upper layers 317b and 318b of the second shape conductive layers 317 and 318 function as masks, thereby forming a fourth impurity region 327 where p-type impurity elements are doped into the island-shaped semiconductor layer 310 which is used for a p-channel TFT. In this embodiment mode, ion doping using diborane ($B_2H_6$) is employed. As for the fourth impurity region, the concentration of the n-type impurity region and that of the p-type impurity region are different in the overlapping region of the lower layers 317a and 318a of the second shape conductive layers 317 and 318 and in the other region. However, in either region, by doping p-type impurity elements at a concentration range of $2\times10^{20}$ to $2\times10^{21}$ atoms/$cm^3$, the p-type conductivity becomes dominant, thus the fourth impurity region can function as a source region and a drain region of a p-channel TFT without causing problems.

By means of the above-described steps, impurity regions are formed in each of the island-shaped semiconductor layers.

Next, a first interlayer insulating layer 330 is formed so as to cover the inland-shaped semiconductor layers 309 and 310, the second insulating layer 311, and the second shape conductive layers 317 and 318 (FIG. 7A). An insulating film comprising silicon such as silicon oxide, silicon nitride, and silicon oxynitride may be used as the first interlayer insulating layer 330, and the film thickness is set to be about 100 to 200 nm.

Next, heat treatment is performed so as to activate the impurity elements doped into the island-shaped semiconductor layers 309 and 310. This step can be performed by thermal annealing using an annealing furnace, laser annealing, or rapid thermal annealing (RTA). For example, when performing activation by thermal annealing, it is performed at a temperature of 400 to 700° C. (preferably from 500 to 600° C.) under a nitrogen atmosphere containing oxygen at a concentration of 1 ppm or less, preferably 0.1 ppm or less. In addition, heat treatment is performed at 300 to 450° C. for 1 to 12 hours in an atmosphere containing hydrogen by 3 to 100%, thus performing hydrogenation of the island-shaped semiconductor layer. This process is performed in order to terminate dangling bonds in the semiconductor layer by using thermally excited hydrogen. Plasma hydrogenation (using hydrogen excited by plasma) may also be employed as another means of hydrogenation. Further, the activation may also be performed before forming the first interlayer insulating layer 330.

In accordance with the series of steps described above, an n-channel TFT 331 which is used as a DRAM and a p-channel TFT 332 which controls the current supply to an OLED can be formed.

Although the second impurity region 322 which functions as an LDD region wholly overlaps with the lower layers 317a and 318a of the second shape conductive layers 317 and 318 in this embodiment mode, the invention is not limited to this structure. For example, by performing doping between the first etching process and the second etching process, a source or a drain region is formed, and further the lower layer is etched to have a shorter channel length in the channel length direction by the second etching process. Accordingly, it becomes possible to form both regions that overlap with the lower layers 317a and 318a of the second shape conductive layers 317 and 318 and other regions that do not overlap.

It is to be noted that, the plasma etching process described above is not limited to ICP etching. For example, electron cyclotron resonance (ECR) etching, RIE etching, helicon wave etching, helical resonance etching, pulse modulation etching, and other plasma etching may also be used.

Although only the crystallization by a catalytic element is exemplified in this embodiment mode, the invention is not limited to this. It is also possible to perform laser light irradiation of pulse oscillation in order to enhance crystallinity after the completion of the crystallization by a catalytic element. In addition, the gettering step of the invention is not limited to the one shown in this embodiment mode. Other methods may also be employed so as to reduce catalytic elements in the semiconductor layer. For example, catalytic elements may be removed by utilizing a gettering action of phosphorus as disclosed in Japanese Patent Application Laid-open No. Hei10-135468 or Hei10-135469.

Next, a second interlayer insulating layer 333 and a third interlayer insulating layer 334 are formed so as to cover the first interlayer insulating layer 330. In this embodiment mode, an organic resin such as non-photosensitive acryl is used for the second interlayer insulating layer 333. For the third interlayer insulating layer 334, a film that allows with difficulty, in comparison with other insulating layers, transmitting substances such as moisture and oxygen that may cause the deterioration of the OLED is used. Typically, a DLC film, a carbon nitride film, a silicon nitride film formed by means of RF sputtering, and the like may be preferably used.

Subsequently, by etching the second insulating layer 311, the first interlayer insulating layer 330, the second interlayer insulating layer 333, and the third interlayer insulating layer 334, contact holes are formed. Then, wirings 335 to 338 which are in contact with the island-shaped semiconductor layers 309 and 310 are formed.

By forming a transparent conductive layer, covering the third interlayer insulating layer 334 and the wirings 335 to 338, and then patterning it, a pixel electrode (anode) 340 which is connected to the wiring 338 in contact with the island-shaped semiconductor layer 310 of the p-channel TFT 332 is formed (FIG. 7B). For the pixel electrode 340, a transparent conductive film provided by mixing 2 to 20% of zinc oxide (ZnO) with indium oxide may be used as well as ITO. The pixel electrode 340 may be wiped and polished with CMP by using a PVA (polyvinyl alcohol) porous body to level off the surface. Also, after polishing the surface of the pixel electrode 340 by CMP, it may be subjected to ultraviolet ray irradiation or oxygen plasma treatment and the like.

Then, an organic resin layer 341 which is used as a bank is formed on the third interlayer insulating layer 334. The organic resin layer 341 is formed to have an opening in the overlapping region with the pixel electrode 340. The organic resin layer 341, before a light emitting layer is formed, is heated in a vacuum atmosphere in order to remove absorbed moisture and oxygen. Specifically, heat treatment is applied in a vacuum atmosphere at a temperature of 100 to 200° C. for substantially about 0.5 to 1 hour. The vacuum is desirably set at $3\times10^{-7}$ Torr or less, and if possible, at $3\times10^{-8}$ Torr or less. In the case of depositing a light emitting layer after applying heat treatment onto the organic resin layer 341 in the vacuum atmosphere, the reliability can be further heightened by maintaining the light emitting layer in the vacuum atmosphere until immediately before the deposition.

As for an end portion in the opening of the organic resin layer 341, it is desirable to be formed roundish so that the light emitting layer to be formed later will have no holes in the end. Specifically, a curvature radius of the curved line shown by the sectional surface of the organic resin layer 341 in the opening is desirably in the range of 0.2 to 2 ì m.

In an example shown in FIG. 7C, a positive photosensitive acrylic resin is used as the organic resin layer 341. Photosensitive organic resin is classified into a positive type and a negative type: if a portion of a resin film that is exposed to an energy beam such as photo, electron, and ion is removed, it is the positive type, and if the exposed portion remains whereas the rest is removed, it is the negative type. In the invention, the negative organic resin layer may also be used. In addition, the organic resin layer 341 may also be formed by using photosensitive polyimide.

When the organic resin layer 341 is formed by using negative photosensitive acrylic, an end portion in the opening of the organic resin layer 341 takes on an S-shaped cross section. It is desirable that curvature radius of the curved line in an upper end portion and a lower end portion of the opening be from 0.2 to 2 ì m.

According to the above structure, the coverage of a light emitting layer and a cathode that are formed later can be enhanced. Thus, it can be prevented that the pixel electrode 340 and the cathode are shorted-circuited in the holes that are formed in the light emitting layer. Moreover, by alleviating the stress of the light emitting layer, defect called shrink, in which a light emitting region decreases, can be reduced and the reliability is thus enhanced.

Next, a light emitting layer 342 is formed on the pixel electrode 340. The light emitting layer 342 comprises one or a plurality of layers, which may include inorganic layers as well as organic layers.

Then, a cathode 343 is formed so as to cover the light emitting layer 342. For the cathode 343, as far as being a conductive film having a low work function, any known materials can be used. For example, Ca, Al, CaF, MgAg, AlLi and the like are preferably used.

The pixel electrode 340, the light emitting layer 342, and the cathode 343 overlap with each other in the opening of the organic resin layer 341, and the overlapping region corresponds to an OLED 344.

A protective layer 345 is formed over the organic resin layer 341 and the cathode 343. As well as the third interlayer insulating layer 334, the protective layer 345 is formed of a film that allows with difficulty, in comparison with other insulating films, transmitting substances such as moisture and oxygen that may cause the deterioration of the OLED. Typically, for example, a DLC film, a carbon nitride film, or a silicon nitride film formed by RF sputtering or the like is preferably used. It is also possible to form a protective layer by laminating the above-described film that allows transmitting substances such as moisture and oxygen with difficulty, and a film that allows with ease, in comparison with the former film, transmitting substances such as moisture and oxygen.

Although the example shown in FIG. 7C employs a structure in which light emitted from the OLED is emitted to the substrate 301 side, a structure in which light emitted from the OLED is emitted to the opposite side of the substrate may be employed as well.

Practically, when the device has been completed up to the stage shown in FIG. 7C, a protective film (a laminate film, an ultraviolet curing resin film or the like) having good airtightness and less degasification or a transparent covering material is desirably used to package (seal) the device without exposing it to air. At that time, the reliability of the OLED is enhanced if the inside of the covering material is filled with an inert atmosphere or a moisture absorption material (e.g., barium oxide) is disposed inside.

By utilizing the above-described fabrication method, the n-channel TFT 331 which is used as a memory element of the DRAM and the p-channel TFT which is formed in the pixel portion can be fabricated on the same substrate.

It is to be noted that, after forming an integrated circuit including DRAM and a pixel portion on a substrate, and then separating both of them from the substrate, they may be transferred to another substrate. For the transfer, various methods can be adopted such as the one in which a metal oxide film is disposed between an integrated circuit and a pixel portion, and a substrate, and the integrated circuit and the pixel portion are separated from the substrate by weakening the metal oxide film by crystallization, thereby transferring them to another substrate; the one in which an amorphous silicon film containing hydrogen is disposed between an integrated circuit and a pixel portion, and a substrate, and the integrated circuit and the pixel portion are separated from the substrate by removing the amorphous silicon film by laser light irradiation or etching, thereby transferring them to another substrate; and the one in which a substrate mounting an integrated circuit and a pixel portion is removed mechanically or by etching by use of solution or gas, thereby cutting the integrated circuit and the pixel portion off the substrate to transfer them to another substrate. In either method, transfer may desirably be carried out before completing display elements in a pixel portion. For example, in the case of a liquid crystal display device, it may desirably be carried out before attaching a counter electrode and injecting a liquid crystal into a liquid crystal display device, and in the case of a light emitting device, be carried out before forming a light emitting layer.

It is to be noted that, the semiconductor device of the invention is not exclusively limited to the light emitting device shown in this embodiment mode. The light emitting device described above is only a specific example as one embodiment mode of the invention, and therefore the invention is not limited to this. Thus, various modification based on a technical idea can be applied to the invention.

As described above, according to the invention, data can be stored in a thin film transistor, thus no additional capacitor is required and a memory cell area can be reduced. Therefore, high integration and large memory capacity of an integrated circuit mounting a DRAM can be realized while cutting costs. Further, according to the high integration and large memory capacity of an integrated circuit, the integrated circuit occupies a smaller area of a substrate on which a pixel portion of a flat panel is formed together, thus high-performance system-on-panel can be implemented.

Embodiment 1

A DRAM comprising a switching element as well as a TFT which is used as a memory element is described.

Figure 8A:
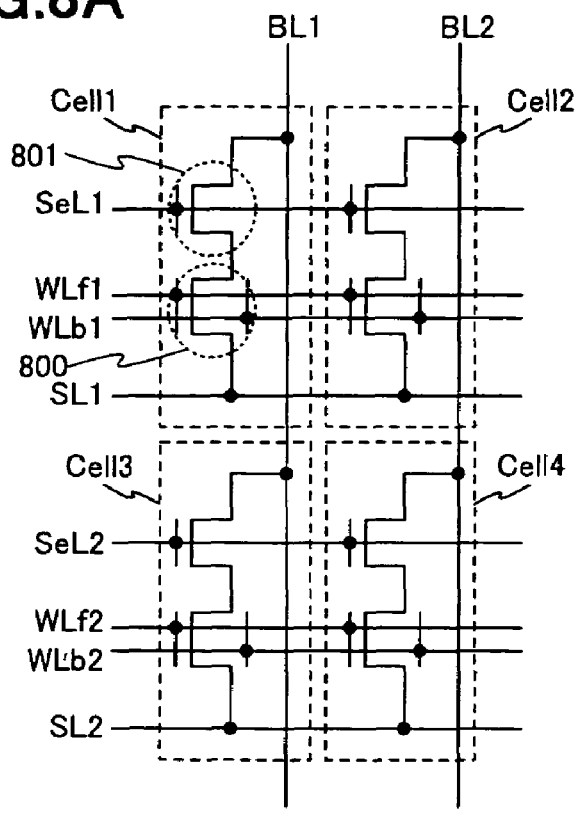
FIGS. 8A and 8B are a circuit diagram of a cell array of a DRAM and a timing chart respectively.

An example of a circuit diagram of a cell array of a DRAM according to the present embodiment is shown in FIG. 8A. The cell array shown in FIG. 8A comprises four memory cells (Cell1, Cell2, Cell3, and Cell4), and each memory cell is provided with a TFT 800 which functions as a memory element and a TFT 801 which functions as a switching element. Although four memory cells are disposed in the memory cell array in FIG. 8A, the number of memory cells is, needless to mention, not limited to this.

The TFT 800 in each memory cell receives potentials Vbg and Vfg from word lines WLb and WLf respectively, and a potential Vs from a source line SL. The supply of a potential Vd from a bit line BL is controlled by the TFT 801. Switching of the TFT 801 is controlled by a potential supplied to its gate electrode from a select line SeL. Note that, the layout of each wiring is not limited to the configuration shown in FIG. 8A. Moreover, other wirings may be provided in addition to these wirings.

As the TFT 801 functions as a switching element, its conductivity type is not specifically limited and either an n-channel or p-channel TFT can be employed. The TFT 801 is operated so as to be turned ON during writing, reading, and purging, while turned OFF during holding.

By providing a TFT as a switching element, selectivity of a memory cell can be improved. Specifically, considered here is the memory cell (Cell3) in the case of applying 5 V to the BL1 for writing data into the memory cell (Cell1) which is in the same column as the memory cell (Cell3). In this case, when no switching element is provided, potential difference may be generated between the source and drain of the TFT which configures the memory cell (Cell3), leading to a bad influence upon the state of the memory cell (Cell3). On the other hand, in the case where a switching element is provided, and turned OFF, such potential difference is not generated, thus it does not give stress on the memory cell (Cell3). As a result, it becomes possible to reduce malfunction due to stress and improve refreshing intervals.

In addition, in the case of providing no switching element, every source line is controlled independently, whereas in the case of providing a switching element, unnecessary potential difference between the source and drain in the non-selected memory cell may be removed, thus it becomes possible to set potentials of all source lines equal to each other. As a result, advantageous effects can be obtained such that the configuration of a driver circuit is simplified, and an area of a source line is reduced.

It is to be noted that, in order to cause impact ionization efficiently in the TFT 800, or to read out current difference of the TFT 800 in between reading and selecting, a potential Vgs of the gate electrode of the TFT 801 in selecting is desirably set higher than a potential Vgs of the gate electrode of the TFT 800.

Figure 8B:
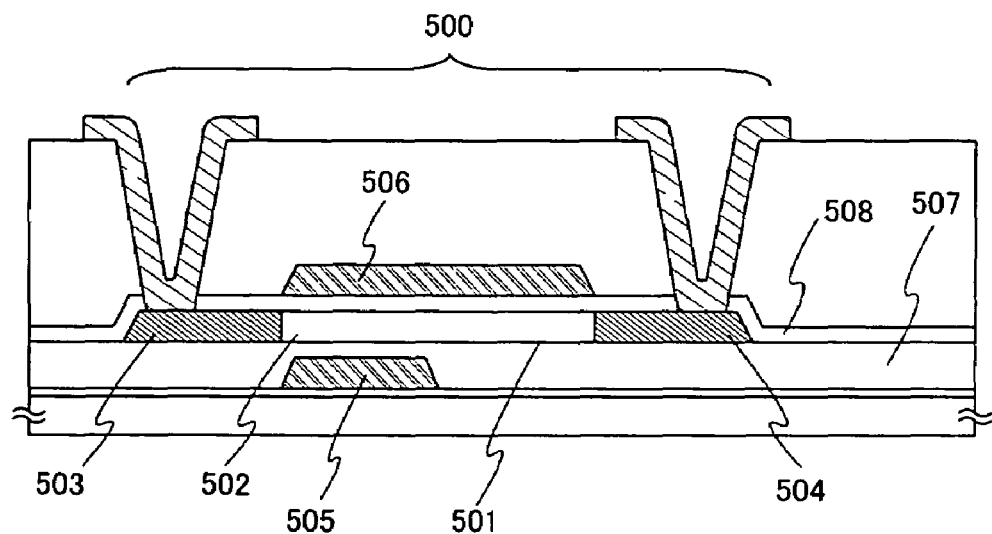

When both of the TFTs 800 and 801 are n-channel types, it is also possible to combine the select line SeL and the word line WLf into one for common use, thus reducing the number of power supplies. Further, in this case, the TFTs 800 and 801 can be combined into one TFT by sequentially forming each active layer. FIG. 8B shows a cross-sectional view of a TFT 500 which is obtained by sequentially forming barrier layers of the TFTs 800 and 801.

In FIG. 8B, reference numeral 501 denotes an active layer which comprises a channel forming region 502, a source region 503, and a drain region 504. Further, reference numeral 505 denotes a first electrode, 506 denotes a second electrode, 507 denotes a first insulating layer, and 508 denotes a second insulating layer. The first electrode 505 overlaps with the second electrode 506 with the active layer 501 interposed therebetween. The first electrode 505 further overlaps with the channel forming region 502 with the first insulating layer 507 interposed therebetween. The second electrode 506 overlaps with the channel forming region 502 with the second insulating layer 508 interposed therebetween.

In FIG. 8B, the first electrode 505 overlaps with only a part of the channel forming region 502. The drain region 504 in the channel forming region 502 does not overlap with the first electrode 505 whereas it overlaps partially with the second electrode 506. In this manner, by integrating the word line WLf and the select line SeL and sequentially forming active layers, a memory cell area can be decreased as compared to the case of providing two TFTs, and further the holding operation of charges can be performed accurately in the same manner as in the case of providing two TFTs.

Embodiment 2

Described in this embodiment is a structure of a memory cell of a DRAM which is mounted on the integrated circuit of the invention.

Figure 9A:
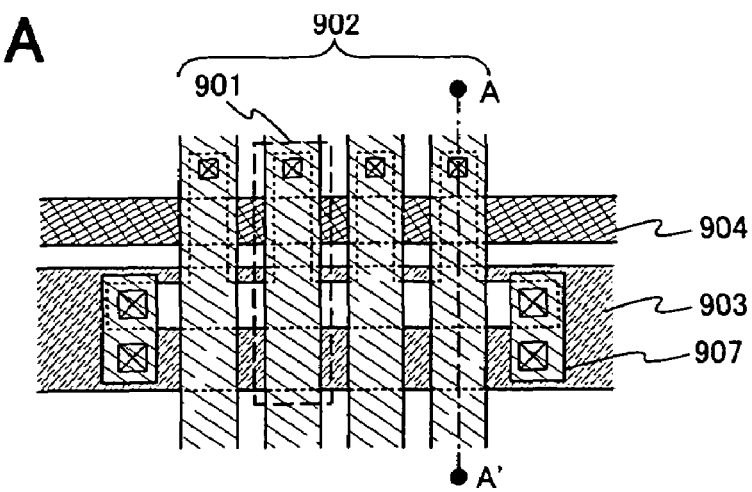
FIG. 9A is a top plan view showing a memory cell of a DRAM.

FIG. 9A shows a top plan view of memory cell of the present embodiment. A memory cell shown in FIG. 9A comprises a TFT 901 which functions as a memory element. Reference numeral 902 denotes a bit line BL, 903 denotes a source line SL, and 904 denotes a word line WLf. As shown in FIG. 9A, the source line SL 903 is obtained by patterning the same conductive layer as a word line WLb 906.

Figure 9B:
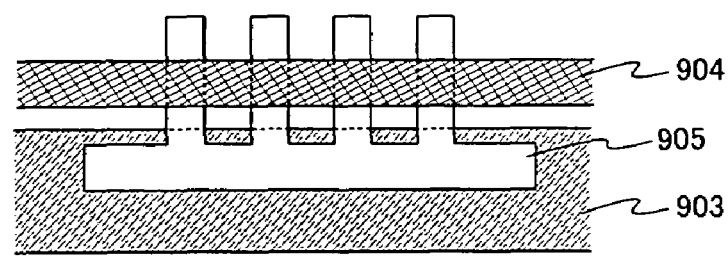
FIGS. 9B to 9D are cross-sectional views of the same.

FIG. 9B shows a top plan view of the memory cell shown in FIG. 9A, prior to the formation of the bit line BL 902 on a top layer. Reference numeral 905 denotes an active layer of the TFT 902. The word line WLf 904 partially overlaps with the active layer 905 with a second insulating layer (not shown) interposed therebetween, and it functions as a second electrode. In this embodiment, the word line WLf 904 is disposed between the active layer 905 and the bit line BL 902.

Figure 9C:
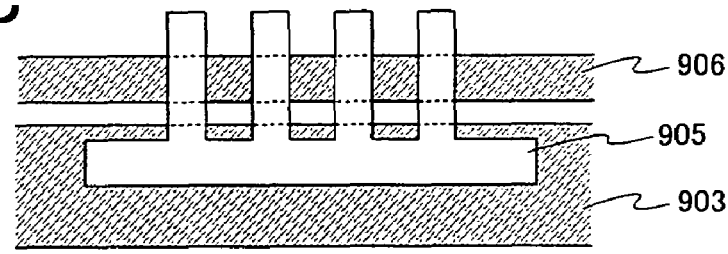

FIG. 9C shows a top plan view of the memory cell shown in FIG. 9B, prior to the formation of the word line WLf 904. The word line WLb 906 partially overlaps with the active layer 905 with a first insulating layer (not shown) interposed therebetween, and it functions as a first electrode. In this embodiment, the source line SL 903 and the word line WLb 906 are provided in a lower layer (substrate side) than the active layer 905.

Figure 9D:
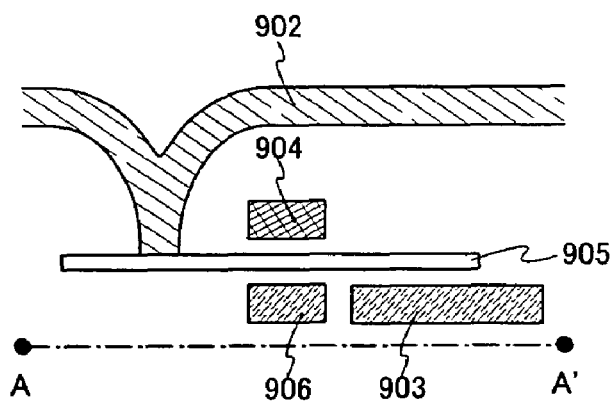

FIG. 9D shows a cross-sectional view cut along a line A–A' in FIG. 9A. The word line WLf 904 and the word line WLb 906 overlap with each other with the active layer 905 interposed therebetween as shown in FIG. 9D. Note that, although the source line SL 903 is formed by using the same conducting layer as the word line WLb 906 in this embodiment, the source line SL 903 may be formed with an upper conducting layer than the bit line BL 902.

Figure 11:
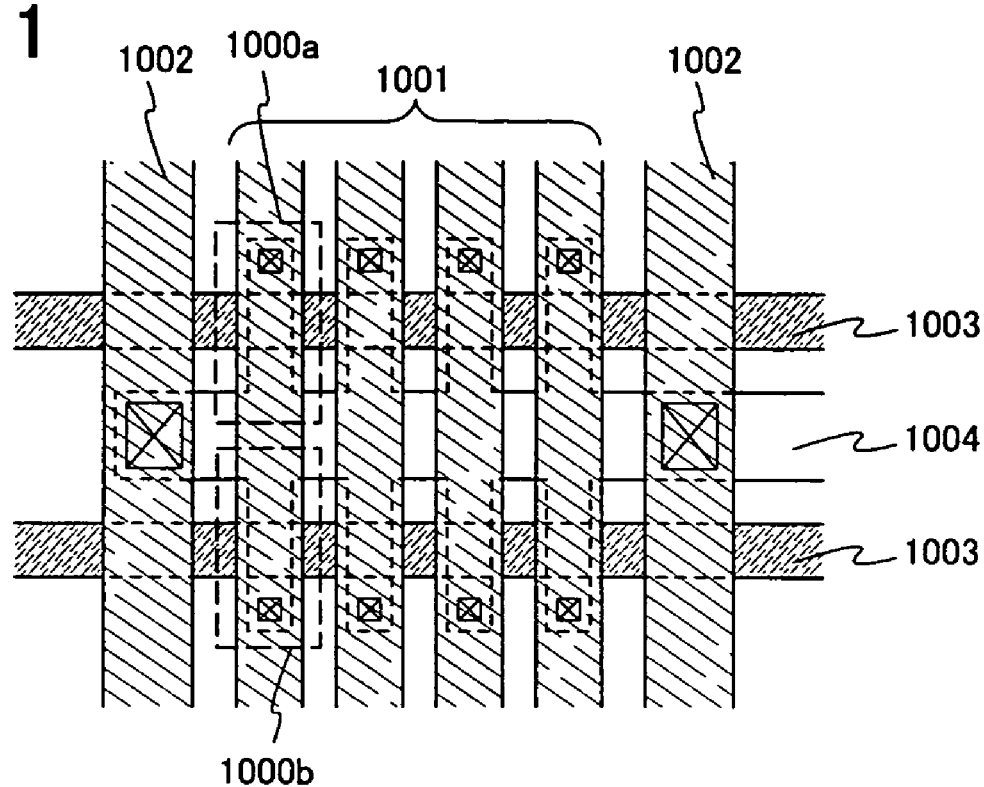
FIG. 11 is a top plan view of a memory cell of a DRAM.

Note also that, in the case of fixing a potential of the source line, adjacent memory cells each having a different word line may have a common source line. FIG. 11 shows a top plan view of a memory cell of the invention which is different from FIGS. 9A to 9D. Reference numerals 1000a and 1000b each denote memory cells, 1001 denotes a bit line BL, 1002 denotes a source line SL, and 1003 denotes a word line WLf. The memory cells 1000a and 1000b have an active layer 1004 and the bit line BL 1001 in common. Note that, a word line WLb is, though not shown in the top plan view of FIG. 11, disposed in a lower layer of the active layer 1004 while overlapping with the word line WLf 1003. As shown in FIG. 11, when adjacent memory cells have an active layer or a source line in common, the layout area can be further reduced.

Embodiment 3

In this embodiment, a configuration of a microprocessor which is one of the integrated circuits of the invention is described.

Figure 10:
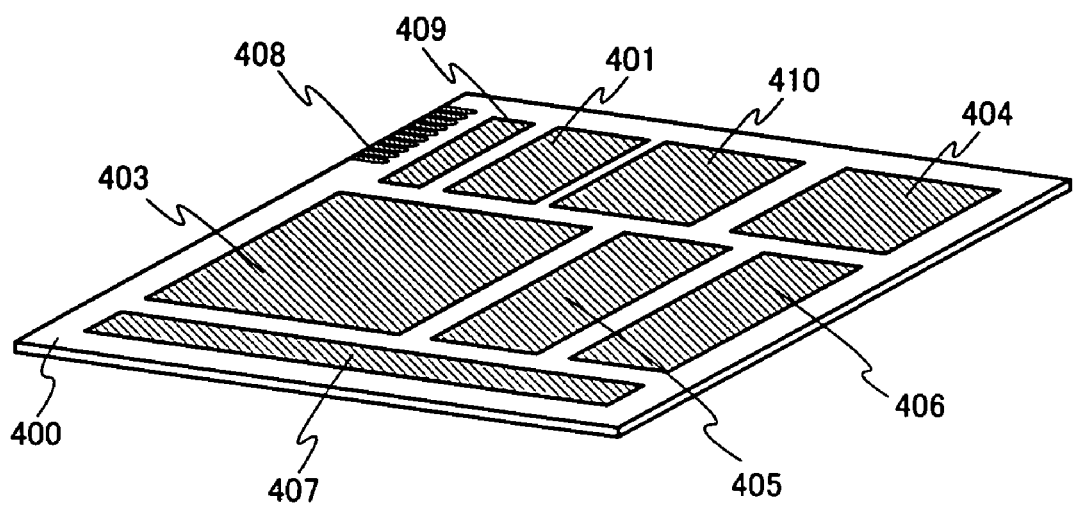
FIG. 10 is a perspective view of a microprocessor as one of the integrated circuits of the invention.

FIG. 10 shows a perspective view of a microprocessor of the present embodiment. The microprocessor comprises a substrate 400 which is mounted with a CPU 401, a main memory 403, a clock controller 404, a cache controller 405, a serial interface 406, an I/O port 407, a terminal 408, an interface 409, a cache memory 410, and the like. It is needless to mention that the schematic view of the microprocessor shown in FIG. 10 is only an example and therefore microprocessors in practice take various configurations according to their practical use.

In order to operate the CPU 401 at a higher rate, a memory which is operable at a corresponding rate to that of the CPU is required. However, when using a high capacity memory which is operable at a high rate and having an access time corresponding to an operating rate of the CPU 401, cost increases generally. Thus, in addition to the high capacity main memory 403, the cache memory 410 which has lower capacity than the main memory 403 but can operate at a higher rate is interposed between the CPU 401 and the main memory 403. By accessing the cache memory 410, the CPU 401 can operate at a high rate without depending on the operating rate of the main memory 403.

According to the integrated circuit of the invention, a DRAM is employed for the main memory 403 to achieve cost reduction and large memory capacity, and an SRAM is employed for the cache memory 410 to achieve a high operating rate.

It is to be noted that, the main memory 403 stores a program which is executed in the CPU 401. The program stored in the main memory 403 is, for example, downloaded to the cache memory 410 in the initial stage of execution. A program to be downloaded is not limited to the one that is stored in the main memory 403, and programs from external memories can be downloaded as well. The cache memory 410 functions as a work area as well as storing a program which is to be executed in the CPU 401, and it temporarily stores calculations.

The number of CPUs is not limited to one, and a plurality of CPUs may be provided as well. When a plurality of CPUs are provided to perform parallel processing, the operating rate can be improved. In that case, the balance of the operating rate between each CPU which serves as a slave may be controlled by means of a CPU which serves as a master since inconvenience may occur in viewing the processing as a whole when the operating rate between each CPU varies from each other.

Although a microprocessor is taken as an example of an integrated circuit in this embodiment, a DRAM which is used in the integrated circuit of the invention is not exclusively applied to a main memory of a microprocessor. It may desirably be applied, for example, to a video RAM used in a driver circuit of a display device, or to a high capacity memory used in an image processing circuit. Further, it can be applied to a high-capacity or a small memory in various system LSIs.

Embodiment 4

Described specifically in this embodiment are steps for writing data when a potential Vbg is supplied to a plurality of memory cells from a common wiring.

Figure 12:
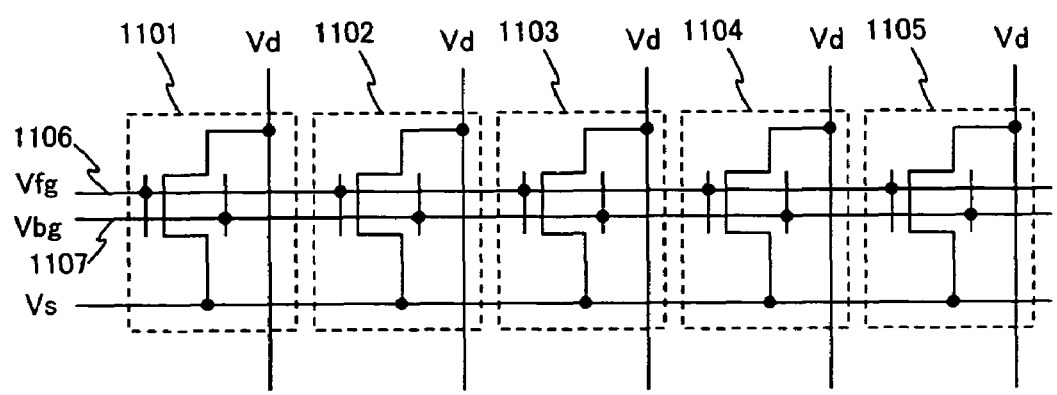
FIG. 12 is a partial circuit diagram of a cell array of a DRAM.

FIG. 12 shows a partial circuit diagram of a cell array of this embodiment. Memory cells 1101 to 1105 in FIG. 12 all receive a potential Vbg of a first gate electrode from a common wiring 1106. The memory cells 1101 to 1105 also receive a potential Vfg of a second gate electrode from a common wiring 1107. Data having three states is assumed to be written by using the memory cells 1101 to 1105 in FIG. 12.

Specifically, data which is written to the memory cells 1101 to 1105 is assumed to be 0, 1, 0, 2, and 1 in this order. The data "0" corresponds to a case where a drain voltage is lower than a threshold voltage of impact ionization, and the data "1" and "2" each corresponds to a case where holes are accumulated by impact ionization. The cumulative amount of data "2" is to be higher than that of the data "1".

First, in the first writing, a drain voltage is set lower than the threshold voltage of impact ionization in each of the memory cells 1101 and 1103 which correspond to the data "0". In the memory cells 1102, 1104, and 1105 which correspond to the data "1", a drain voltage is set higher than the threshold voltage of impact ionization. According to the above operation, no charge is accumulated in the memory cells 1101, 1103, and 1104, and holes corresponding to the data "1" are accumulated in the memory cells 1101, 1103, and 1104. Specifically, a voltage Vd which is supplied to each TFT in the memory cells 1101 to 1105 is set at 2 V, 5 V, 2 V, 2 V, and 5 V respectively. In addition, to each TFT in the memory cells 1101 to 1105, a potential Vs of 0 V, a potential Vfg of 3 V, and a potential Vbg of −4 V are supplied.

In the second writing, a drain voltage is set lower than the threshold voltage of impact ionization in the memory cells 1101, 1102, 1103, and 1105 which correspond to the data "0" and "1". In the memory cell 1104 which corresponds to the data "2", a drain voltage is set higher than the threshold voltage of impact ionization. At this time, a potential Vbg which is supplied to the wiring 1107 is set lower than that in the first writing, and the amount of charges which are accumulated in the memory cell 1105 are made to be larger than that in the first writing. According to the above operation, holes corresponding to the data "2" are accumulated in the memory cell 1104 while the data "0" is held in the memory cells 1101 and 1103, and the data "1" is held in the memory cells 1102 and 1105. Specifically, a voltage Vd which is supplied to each TFT in the memory cells 1101 to 1105 is set at 2 V, 2 V, 2 V, 5 V, and 2 V respectively. In addition, to each TFT in the memory cells 1101 to 1105, a potential Vs of 0 V, a potential Vfg of 3 V, and a potential Vbg of −6 V are supplied.

It is to be noted that, writing may not necessarily be started in sequence from the memory cell in which the smallest amount of holes are accumulated.

According to the present embodiment, a DRAM for storing data which has three states is taken as an example, however, when the state of data is generalized as n (n is an integer not less than three), the number of writings is shown by (n−1).

Embodiment 5

In this embodiment, a method for reading out data from a memory cell is described. Taken as an example in this embodiment is a case of reading out three-state data, however, this embodiment is not exclusively limited to this and it can be applied to reading out data having four states or more.

Figure 13A:
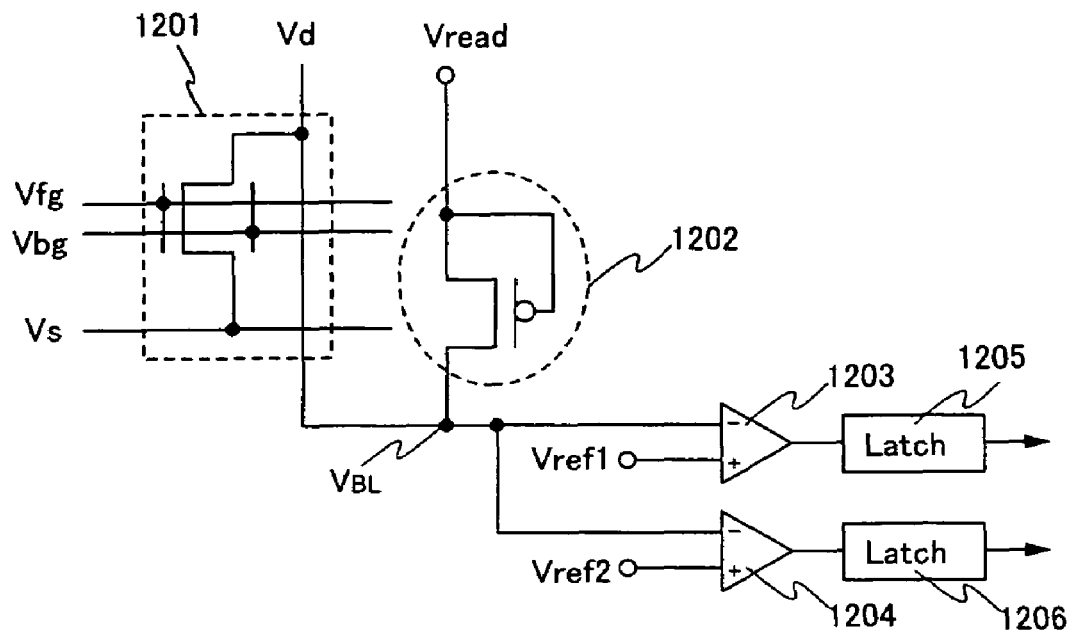
FIGS. 13A and 13B are exemplary diagrams showing a memory cell and a method for reading out data from the memory cell respectively.

The circuit shown in FIG. 13A comprises a TFT 1201 which is disposed in a memory cell, a transistor 1202 for reading data from the TFT 1201, and two operational amplifiers 1203 and 1204. A gate electrode and a source region of the transistor 1202 are electrically connected to each other (so-called diode connection), and function as a resistor. Note that, although a diode-connected transistor is used as a resistor in this embodiment, the invention is not exclusively limited to this and an alternate element may also be employed as far as it functions as a resistor. In addition, although two operational amplifiers are used for reading data in the embodiment, the number of operational amplifiers is not limited to this. When data has n states (n is an integer not less than three), (n−1) operational amplifies are employed.

The size of a drain current of the TFT 1201 is controlled by the amount of holes which are accumulated in its channel forming region. Specifically, the larger the cumulative amount of holes are, the larger the drain current is obtained, and vice versa, the smaller the cumulative amount of holes are, the smaller the drain current is obtained. That is, the larger the cumulative amount of holes are, the lower the resistance between a source region and a drain region of the TFT 1201 becomes, and vice versa, the smaller the cumulative amount of holes are, the higher the resistance between the source region and the drain region of the TFT 1201 becomes. In view of the foregoing, the drain region of the TFT 1201 is connected in series with the TFT 1202 which serves as a resistor, and the value of the drain current is measured indirectly by using the potential $V_{BL}$ at the connection node.

Specifically, the drain region of the TFT 1201 and the drain region of the TFT 1202 which serves as a resistor are connected to each other, and their node is connected to each inverted input terminal of the two operational amplifiers 1203 and 1204. Also, a stationary potential Vread is supplied to the source region of the TFT 1202, a potential Vref1 is supplied to a non-inverted input terminal of the operational amplifier 1203, and a potential Vref2 is supplied to a non-inverted input terminal of the operational amplifier 1204. The relationship between each potential is Vread>Vref2>Vref1. Thus, a potential of each output terminal of the operational amplifiers 1203 and 1204 differs depending on the condition whether the node potential $V_{BL}$ is higher or lower than the potential Vref1, and whether the node potential $V_{BL}$ is higher or lower than the potential Vref2. Potentials at the output terminals of the operational amplifiers 1203 and 1204 are stored in latch circuits 1205 and 1206 respectively.

Figure 13B:
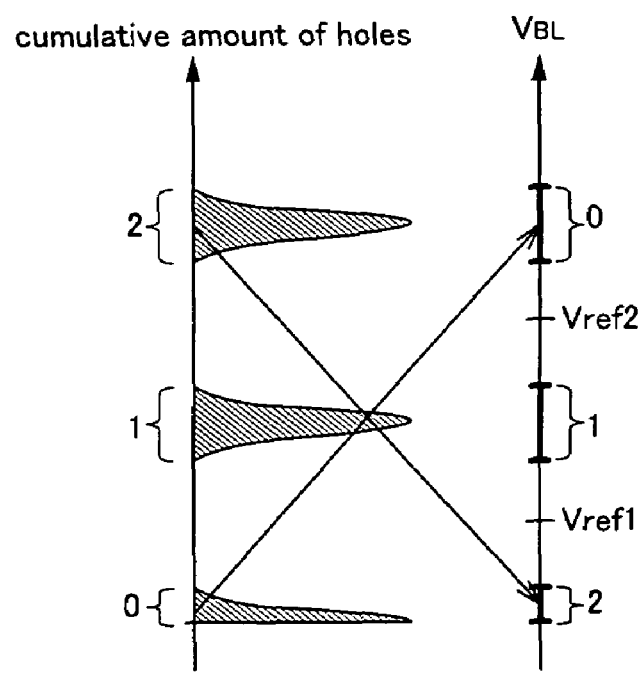

FIG. 13B shows the distribution of a memory cell corresponding to each cumulative amount of holes, and the correlation between each data "0", "1", and "2" and the node potential $V_{BL}$. The cumulative amount of holes in a memory cell which stores each data have certain variations. Therefore, even in the memory cell where the same data is stored, the corresponding node potential $V_{BL}$ will also have variations. The basic potentials Vref1 and Vref2 are determined by taking the variations of the node potential $V_{BL}$ into account to read out the state of each data accurately.

It is to be noted that, although data is read by confirming the cumulative amount of holes on the whole by utilizing resistance division in this embodiment, a method for reading data is not exclusively limited to the one shown in this embodiment.

Embodiment 6

Electronic apparatuses, using the integrated circuit or the semiconductor display device according to the invention, include a video camera, a digital camera, a goggle display (head mounted display), a navigation system, a sound reproduction device (a car audio equipment, an audio set, and the like), a notebook personal computer, a game machine, a portable information device (a mobile computer, a portable telephone, a portable game machine, an electronic book, and the like), an image reproduction device including a recording medium (more specifically, a device which can reproduce a recording medium such as a digital video disc (DVD), and which includes a display for displaying the reproduced image), or the like.

By adopting the semiconductor device according to the invention, a frame area on the periphery of a pixel portion can be reduced, and compact electronic apparatuses can thus be realized. Further, by utilizing the integrated circuit of the invention, large memory capacity of a DRAM in the integrated circuit can be achieved, thus high-performance electronic apparatuses can be realized. Specific examples of these electronic apparatuses are shown in FIGS. 14A to 14C.

Figure 14A:
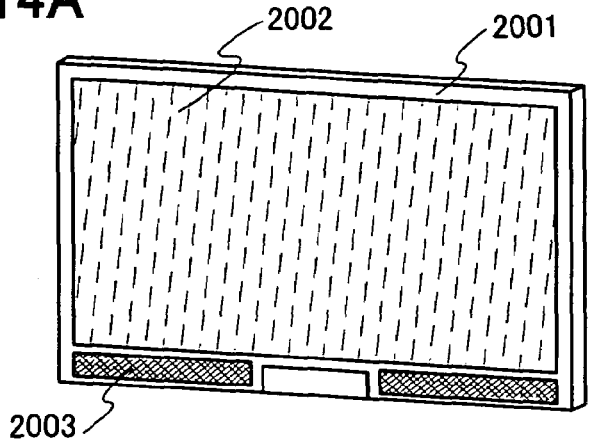
FIGS. 14A to 14C are electronic apparatuses to which the semiconductor display device or the integrated circuit of the invention is applied.

FIG. 14A is a display device, which includes a housing 2001, a display portion 2002, a speaker portion 2003, and the like. The semiconductor display device of the invention can be used as the display portion 2002, and the integrated circuit of the invention can be used as other signal processing circuits. Note that, the display device includes all the information display devices for personal computers, television broadcast reception, advertisement displays, and the like.

Figure 14B:
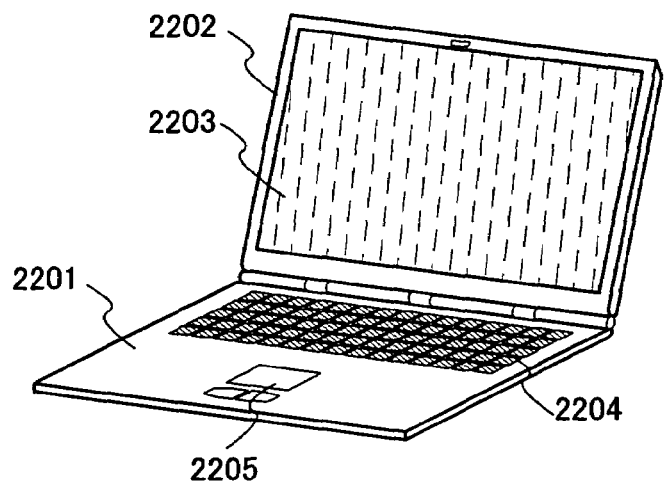

FIG. 14B is a notebook personal computer, which includes a main body 2201, a housing 2202, a display portion 2203, a keyboard 2204, a mouse 2206, and the like. The semiconductor display device of the invention can be used as the display portion 2003, and the integrated circuit of the invention can be used as other signal processing circuits.

Figure 14C:
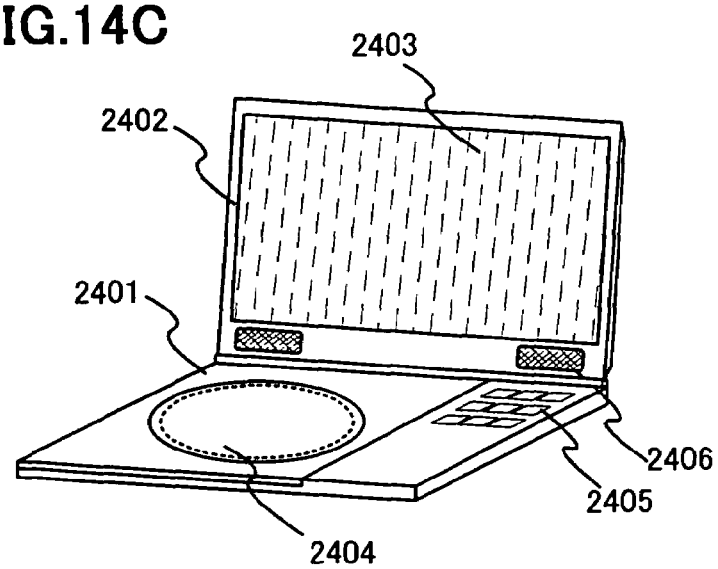

FIG. 14C is a portable image reproduction device provided with a recording medium (specifically, a DVD playback device), which includes a main body 2401, a housing 2402, a display portion 2403, a recording medium (such as a DVD) read-in portion 2404, an operation key 2405, a speaker portion 2406, and the like. Note that, image reproduction devices provided with recording a medium include game machines for domestic use and the like. The semiconductor display device of the invention can be used as the display portion 2403, and the integrated circuit of the invention can be used as other signal processing circuits.

As described above, an application range of the invention is so wide that the invention can be applied to electronic apparatuses in various fields. The electronic apparatuses in this embodiment can employ any configurations shown in the foregoing Embodiments 1 to 5.

Although the present invention has been fully described by way of example with reference to the accompanying drawings, it is to be understood that various modifications will be apparent to those skilled in the art. Therefore, unless otherwise such changes and modifications depart from the scope of the invention hereinafter defined, they should be constructed as being included therein.

What is claimed is:

1. A semiconductor device comprising:
    a DRAM comprising a first thin film transistor over a substrate, the first thin film transistor comprising:
        a first gate electrode over the substrate;
        a first insulating layer over the first gate electrode;
        a first island-shaped semiconductor film over the first insulating layer;
        a second insulating layer over the first island-shaped semiconductor film;
        a second gate electrode over the second insulating layer; and
        a third insulating layer over the second gate electrode;
    a bit line over the third insulating layer and electrically connected to a first impurity region of the first island-shaped semiconductor film;
    a source line over the third insulating layer and electrically connected to a second impurity region of the first island-shaped semiconductor film;
    a pixel portion comprising a second thin film transistor over the substrate, the second thin film transistor comprising:
        a second island-shaped semiconductor film over the first insulating layer;
        the second insulating layer over the second island-shaped semiconductor film;
        a third gate electrode over the second insulating layer; and
        the third insulating layer over the third gate electrode;
    a wiring over the third insulating layer and electrically connected to an impurity region of the second island-shaped semiconductor film; and
    a pixel electrode electrically connected to the wiring, wherein the first and second gate electrodes overlap with each other with the first island-shaped semiconductor film interposed therebetween; and wherein the substrate is selected from the group consisting of a glass substrate, a quartz substrate, a ceramic substrate, a metal substrate, and a substrate formed from a synthetic resin.

2. An electronic device having the semiconductor device according to claim 1, wherein said electronic device is selected from the group consisting of a video camera, a digital camera, a goggle display, a navigation system, a sound reproduction device, a notebook personal computer, a game machine, a portable information device, and an image reproduction device.

3. The semiconductor device according to claim 1, wherein the first gate electrode is connected to a first word line and the second gate electrode is connected to a second word line.

4. The semiconductor device according to claim 1, further comprising a protective layer over the first and second thin film transistors.

5. The semiconductor device according to claim 1, further comprising a third thin film transistor provided between the first thin film transistor and the bit line.

6. The semiconductor device according to claim 1, wherein the second thin film transistor is a thin film transistor for controlling a current supply.

7. The semiconductor device according to claim 1, wherein the first thin film transistor is an n-channel thin film transistor and the second thin film transistor is a p-channel thin film transistor.

8. A semiconductor device comprising:
a DRAM comprising a first thin film transistor over a substrate, the first thin film transistor comprising:
a first gate electrode over the substrate;
a first insulating layer over the first gate electrode;
a first island-shaped semiconductor film over the first insulating layer;
a second insulating layer over the first island-shaped semiconductor film;
a second gate electrode over the second insulating layer; and
a third insulating layer over the second gate electrode;
a bit line over the third insulating layer and electrically connected to a first impurity region of the first island-shaped semiconductor film;
a source line over the third insulating layer and electrically connected to a second impurity region of the first island-shaped semiconductor film;
a pixel portion comprising a second thin film transistor over the substrate, the second thin film transistor comprising:
a second island-shaped semiconductor film over the first insulating layer;
the second insulating layer over the second island-shaped semiconductor film;
a third gate electrode over the second insulating layer; and
the third insulating layer over the third gate electrode;
a wiring over the third insulating layer and electrically connected to an impurity region of the second island-shaped semiconductor film;
a first electrode electrically connected to the wiring;
a light emitting layer over the pixel electrode; and
a second electrode over the light emitting layer;
wherein the first and second gate electrodes overlap with each other with the first island-shaped semiconductor film interposed therebetween, and
wherein the substrate is selected from the group consisting of a glass substrate, a quartz substrate, a ceramic substrate, a metal substrate, and a substrate formed from a synthetic resin.

9. An electronic device having the semiconductor device according to claim 8, wherein said electronic device is selected from the group consisting of a video camera, a digital camera, a goggle display, a navigation system, a sound reproduction device, a notebook personal computer, a game machine, a portable information device, and an image reproduction device.

10. The semiconductor device according to claim 8, wherein the first gate electrode is connected to a first word line and the second gate electrode is connected to a second word line.

11. The semiconductor device according to claim 8, further comprising a protective layer over the first and second thin film transistors.

12. The semiconductor device according to claim 8, further comprising a third thin film transistor provided between the first thin film transistor and the bit line.

13. The semiconductor device according to claim 8, wherein the second thin film transistor is a thin film transistor for controlling a current supply.

14. The semiconductor device according to claim 8, wherein the first thin film transistor is an n-channel thin film transistor and the second thin film transistor is a p-channel thin film transistor.

* * * * *